(12) United States Patent
Pragada et al.

(10) Patent No.: US 10,725,573 B2
(45) Date of Patent: Jul. 28, 2020

(54) ANNULAR PIEZOELECTRIC STRUCTURE FOR ULTRASONIC TOUCH SENSING

(71) Applicant: Apple Inc., Cupertino, CA (US)

(72) Inventors: Anuranjini Pragada, San Jose, CA (US); George Ho Yin Mak, Santa Clara, CA (US); Ehsan Khajeh, San Jose, CA (US); Brian Michael King, Saratoga, CA (US); Maegan K. Spencer, La Honda, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/056,403

(22) Filed: Aug. 6, 2018

(65) Prior Publication Data

US 2020/0042130 A1    Feb. 6, 2020

(51) Int. Cl.
| | | |
|---|---|---|
| *G06F 3/041* | (2006.01) | |
| *H05K 5/00* | (2006.01) | |
| *H05K 5/06* | (2006.01) | |
| *G06F 3/043* | (2006.01) | |

(52) U.S. Cl.
CPC .......... *G06F 3/0414* (2013.01); *G06F 3/0412* (2013.01); *G06F 3/0433* (2013.01); *H05K 5/0017* (2013.01); *H05K 5/06* (2013.01)

(58) Field of Classification Search
CPC .... G06F 3/0414; G06F 3/0412; G06F 3/0433; H05K 5/0017; H05K 5/06
See application file for complete search history.

(56) References Cited

U.S. PATENT DOCUMENTS

| | | | |
|---|---|---|---|
| 3,673,327 | A | 6/1972 | Johnson |
| 3,816,774 | A | 6/1974 | Ohnuki et al. |
| 4,437,033 | A | 3/1984 | Diepers |
| 4,506,354 | A | 3/1985 | Hansen |
| 4,746,914 | A | 5/1988 | Adler |
| 4,825,212 | A | 4/1989 | Adler |

(Continued)

FOREIGN PATENT DOCUMENTS

| | | |
|---|---|---|
| CN | 104919407 A | 9/2015 |
| CN | 107249763 A | 10/2017 |

(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Lisa S Landis
(74) *Attorney, Agent, or Firm* — Kubota & Basol LLP

(57) ABSTRACT

Acoustic touch sensing systems can include a mechanically integrated structure including multiple acoustic transducers. For example, an annular structure including one or more piezoelectric segments can be fabricated and then coupled to a front crystal/cover glass. A single structure can simplify the structural integration of the device, can provide a mechanically reliable and stable structure for improved structural integrity of the system, and can provide for improved water sealing for a waterproof or water resistant device. The piezoelectric material in the annular structure can be shear poled such that a poling direction of the piezoelectric material can follow the curvature of the annular piezoelectric structure.

22 Claims, 15 Drawing Sheets

(56) References Cited

U.S. PATENT DOCUMENTS

| | | |
|---|---|---|
| 5,072,427 A | 12/1991 | Knowles |
| 5,142,511 A | 8/1992 | Kanai et al. |
| 5,483,261 A | 1/1996 | Yasutake |
| 5,488,204 A | 1/1996 | Mead et al. |
| 5,591,945 A | 1/1997 | Kent |
| 5,766,493 A | 6/1998 | Shin |
| 5,816,225 A | 10/1998 | Koch et al. |
| 5,825,352 A | 10/1998 | Bisset et al. |
| 5,835,079 A | 11/1998 | Shieh |
| 5,854,450 A | 12/1998 | Kent |
| 5,880,411 A | 3/1999 | Gillespie et al. |
| 6,078,315 A | 6/2000 | Huang |
| 6,091,406 A | 7/2000 | Kambara |
| 6,188,391 B1 | 2/2001 | Seely et al. |
| 6,225,985 B1 | 5/2001 | Armstrong |
| 6,229,529 B1 | 5/2001 | Yano |
| 6,310,610 B1 | 10/2001 | Beaton et al. |
| 6,323,846 B1 | 11/2001 | Westerman et al. |
| 6,327,011 B2 | 12/2001 | Kim |
| 6,671,380 B2 | 12/2003 | Chang et al. |
| 6,690,387 B2 | 2/2004 | Zimmerman et al. |
| 6,723,929 B2 | 4/2004 | Kent |
| 6,731,270 B2 | 5/2004 | Tosaya |
| 6,856,259 B1 | 2/2005 | Sharp |
| 7,015,894 B2 | 3/2006 | Morohoshi |
| 7,079,118 B2 | 7/2006 | Benard |
| 7,098,891 B1 | 8/2006 | Pryor |
| 7,184,064 B2 | 2/2007 | Zimmerman et al. |
| 7,290,336 B2 | 11/2007 | Buhler et al. |
| 7,489,308 B2 | 2/2009 | Blake |
| 7,499,039 B2 | 3/2009 | Roberts |
| 7,573,466 B1 | 8/2009 | Marzen |
| 7,663,607 B2 | 2/2010 | Hotelling et al. |
| 7,683,894 B2 | 3/2010 | Kent |
| 7,907,129 B2 | 3/2011 | Idzik |
| 8,169,404 B1 | 5/2012 | Boillot |
| 8,325,159 B2 | 12/2012 | Kent et al. |
| 8,479,122 B2 | 7/2013 | Hotelling et al. |
| 8,513,859 B2 | 8/2013 | Nikolovski |
| 8,743,091 B2 | 6/2014 | Bernstein |
| 8,767,355 B2 | 7/2014 | Zhang et al. |
| 8,854,339 B2 | 10/2014 | Kent et al. |
| 8,941,624 B2 | 1/2015 | Kent et al. |
| 9,070,862 B2 | 6/2015 | Bibl et al. |
| 9,122,011 B2 | 9/2015 | Oh et al. |
| 9,304,629 B2 | 4/2016 | Tanaka et al. |
| 9,342,191 B2 | 5/2016 | Lin |
| 9,348,467 B2 | 5/2016 | Scharff et al. |
| 9,362,484 B2 | 6/2016 | Hoisington et al. |
| 9,507,464 B2 | 11/2016 | Hecht et al. |
| 2001/0012002 A1 | 8/2001 | Tosaya |
| 2001/0050677 A1 | 12/2001 | Tosaya |
| 2003/0164820 A1 | 9/2003 | Kent |
| 2004/0164970 A1 | 8/2004 | Benard |
| 2005/0017959 A1 | 1/2005 | Kraus |
| 2005/0052432 A1 | 3/2005 | Kraus |
| 2005/0083313 A1 | 4/2005 | Hardie-Bick |
| 2005/0243071 A1 | 11/2005 | Kent et al. |
| 2005/0248548 A1 | 11/2005 | Tsumura |
| 2006/0026521 A1 | 2/2006 | Hotelling et al. |
| 2006/0097991 A1 | 5/2006 | Hotelling et al. |
| 2006/0125804 A1 | 6/2006 | Kent |
| 2006/0197753 A1 | 9/2006 | Hotelling |
| 2007/0211031 A1 | 9/2007 | Marc |
| 2007/0240913 A1 | 10/2007 | Schermerhorn |
| 2008/0059761 A1 | 3/2008 | Norman |
| 2008/0114251 A1 | 5/2008 | Weymer |
| 2008/0266266 A1 | 10/2008 | Kent |
| 2010/0026667 A1 | 2/2010 | Bernstein |
| 2010/0117993 A1 | 5/2010 | Kent |
| 2011/0234545 A1 | 9/2011 | Tanaka et al. |
| 2012/0293046 A1 | 11/2012 | Nikolovski |
| 2013/0120322 A1 | 5/2013 | Tanaka et al. |
| 2013/0120323 A1 | 5/2013 | Scharff et al. |
| 2013/0188282 A1 | 7/2013 | Zhang et al. |
| 2016/0313793 A1* | 10/2016 | Hong .................. G06F 3/016 |
| 2019/0095045 A1 | 3/2019 | Khajeh |

FOREIGN PATENT DOCUMENTS

| | | |
|---|---|---|
| JP | 2000-163031 A | 6/2000 |
| JP | 2001-14093 A | 1/2001 |
| JP | 2002-342033 A | 11/2002 |
| WO | 2005103872 A2 | 11/2005 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Final Office Action dated Feb. 20, 2013, for U.S. Appl. No. 12/184,232, filed Jul. 31, 2008, 24 pages.

Final Office Action dated Aug. 27, 2013, for U.S. Appl. No. 12/184,232, filed Jul. 31, 2008, 25 pages.

Non-Final Office Action dated Nov. 18, 2011, for U.S. Appl. No. 12/184,232, filed Jul. 31, 2008, 21 pages.

Non-Final Office Action dated Jul. 25, 2012, for U.S. Appl. No. 12/184,232, filed Jul. 31, 2008, 18 pages.

Notice of Allowance dated Mar. 14, 2014, for U.S. Appl. No. 12/184,232, filed Jul. 31, 2008, eight pages.

Non-Final Office Action received for U.S. Appl. No. 16/123,757, dated Oct. 18, 2019, 20 pages.

\* cited by examiner

ANNULAR PIEZOELECTRIC STRUCTURE FOR ULTRASONIC TOUCH SENSING

FIELD OF THE DISCLOSURE

This relates generally to acoustic touch and/or force sensing systems, and more particularly, to an annular piezoelectric structure for shear mode ultrasonic touch sensing.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface. Capacitive-type touch sensing systems, however, can experience reduced performance due to conductive, electrically-floating objects (e.g., water droplets) in contact with the touch-sensitive surface.

SUMMARY

This relates to acoustic touch sensing systems that can be fabricated using a mechanically integrated structure including multiple acoustic transducers. For example, a single structure (e.g., an annular structure, such as a ring or loop) including one or more piezoelectric segments can be fabricated and the single structure can be coupled to (e.g., adhered with an adhesive) a surface (e.g., a front crystal/cover glass). A single structure can simplify the structural integration of the device (e.g., one fabrication step to couple multiple transducers to the surface), can provide a mechanically reliable and stable structure for improved structural integrity of the system, and can provide for improved water sealing for a waterproof or water resistant device. In some examples, the single structure with one or more piezoelectric segments can be prefabricated as a closed loop in the shape of a touch sensitive surface of a device in which it may be integrated and then integrated into the device in one assembly step instead of adding each transducer individually. The piezoelectric material in the annular structure can be shear poled such that a poling direction of the piezoelectric material can follow the curvature of the annular piezoelectric structure.

DETAILED DESCRIPTION

In the following description of various examples, reference is made to the accompanying drawings which form a part hereof, and in which it is shown by way of illustration specific examples that can be practiced. It is to be understood that other examples can be used and structural changes can be made without departing from the scope of the various examples.

This relates to acoustic touch sensing systems that can be fabricated using a mechanically integrated structure including multiple acoustic transducers. For example, a single structure (e.g., an annular structure, such as a ring or loop) including one or more piezoelectric segments can be fabricated and the single structure can be coupled to (e.g., adhered with an adhesive) a surface (e.g., a front crystal/cover glass). A single structure can simplify the structural integration of the device (e.g., one fabrication step to couple multiple transducers to the surface), can provide a mechanically reliable and stable structure for improved structural integrity of the system, and can provide for improved water sealing for a waterproof or water resistant device. In some examples, the single structure with one or more piezoelectric segments can be prefabricated as a closed loop in the shape of a touch sensitive surface of a device in which it may be integrated and then integrated into the device in one assembly step instead of adding each transducer individually. The process of decoupling of the manufacture of this single structure from the rest of the device can allow for mass production of the piezoelectric structure and can improve the manufacturing yield. For example, in some examples, the piezoelectric structure can be tested separately, and only then bonded to the rest of the device to improve the yield. The piezoelectric material in the annular structure can be shear poled such that a poling direction of the piezoelectric material can follow the curvature of the annular piezoelectric structure.

Figure 1A:
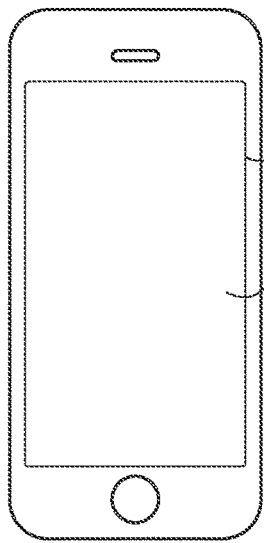
FIGS. 1A-1E illustrate exemplary systems with touch screens that can include acoustic sensors for detecting contact between an object and a surface of the system according to examples of the disclosure.
Figure 1B:
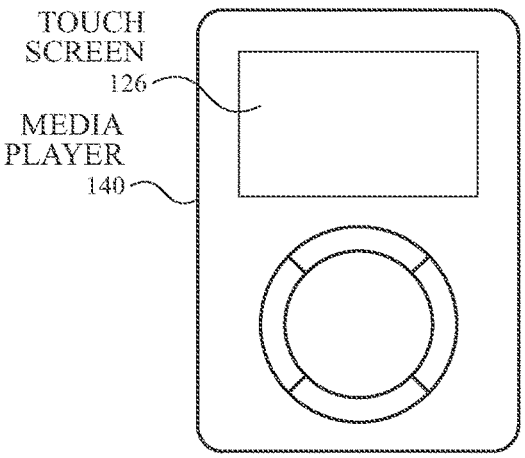
Figure 1C:
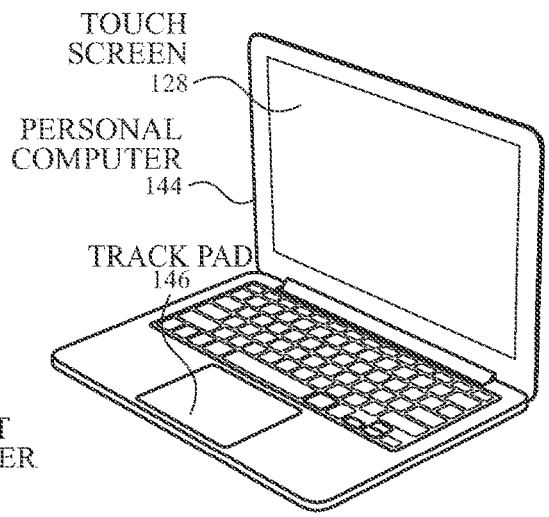
Figure 1D:
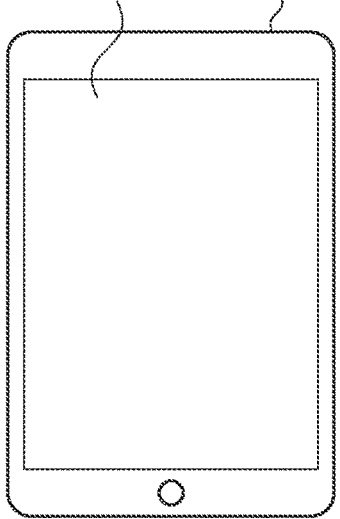
Figure 1E:
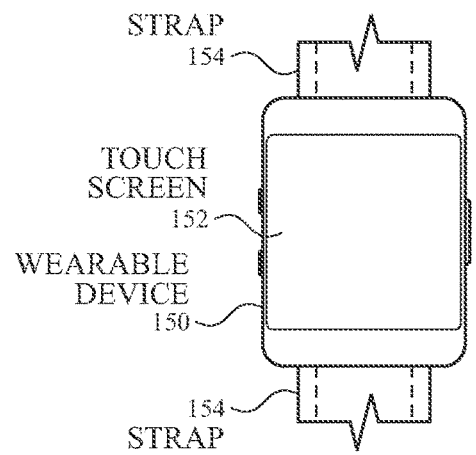

FIGS. 1A-1E illustrate exemplary systems with touch screens that can include acoustic sensors for detecting contact between an object (e.g., a finger or stylus) and a surface of the system according to examples of the disclosure. As described in more detail herein, the acoustic sensors can include one or more transducers formed from piezoelectric material with curves. FIG. 1A illustrates an exemplary mobile telephone 136 that includes a touch screen 124 and can include an acoustic touch sensing system according to examples of the disclosure. FIG. 1B illustrates an example digital media player 140 that includes a touch screen 126 and can include an acoustic touch sensing system according to examples of the disclosure. FIG. 1C illustrates an example personal computer 144 that includes a touch screen 128 and a track pad 146, and can include an acoustic touch sensing system according to examples of the disclosure. FIG. 1D illustrates an example tablet computing device 148 that includes a touch screen 130 and can include an acoustic touch sensing system according to examples of the disclosure. FIG. 1E illustrates an example wearable device 150 (e.g., a watch) that includes a touch screen 152 and can include an acoustic touch sensing system according to examples of the disclosure. Wearable device 150 can be coupled to a user via strap 154 or any other suitable fastener. It should be understood that the example devices illustrated in FIGS. 1A-1E are provided by way of example, and other types of devices can include an acoustic touch sensing system for detecting contact between an object and a surface of the device. Additionally, although the devices illustrated in FIGS. 1A-1E include touch screens, in some examples, the devices may have a non-touch-sensitive display.

Acoustic sensors can be incorporated in the above described systems to add acoustic touch sensing capabilities to a surface of the system. For example, in some examples, a touch screen (e.g., capacitive, resistive, etc.) can be augmented with acoustic sensors to provide a touch sensing capability for use in wet environments or under conditions where the device may get wet (e.g., exercise, swimming, rain, washing hands). In some examples, an otherwise non-touch sensitive display screen can be augmented with acoustic sensors to provide a touch sensing capability. In such examples, a touch screen can be implemented without the stack-up required for a capacitive touch screen. In some examples, the acoustic sensors can be used to provide touch sensing capability for a non-display surface. For example, the acoustic sensors can be used to provide touch sensing capabilities for a track pad 146, a button, a scroll wheel, part or all of the housing or any other surfaces of the device (e.g., on the front, rear or sides).

Figure 2:
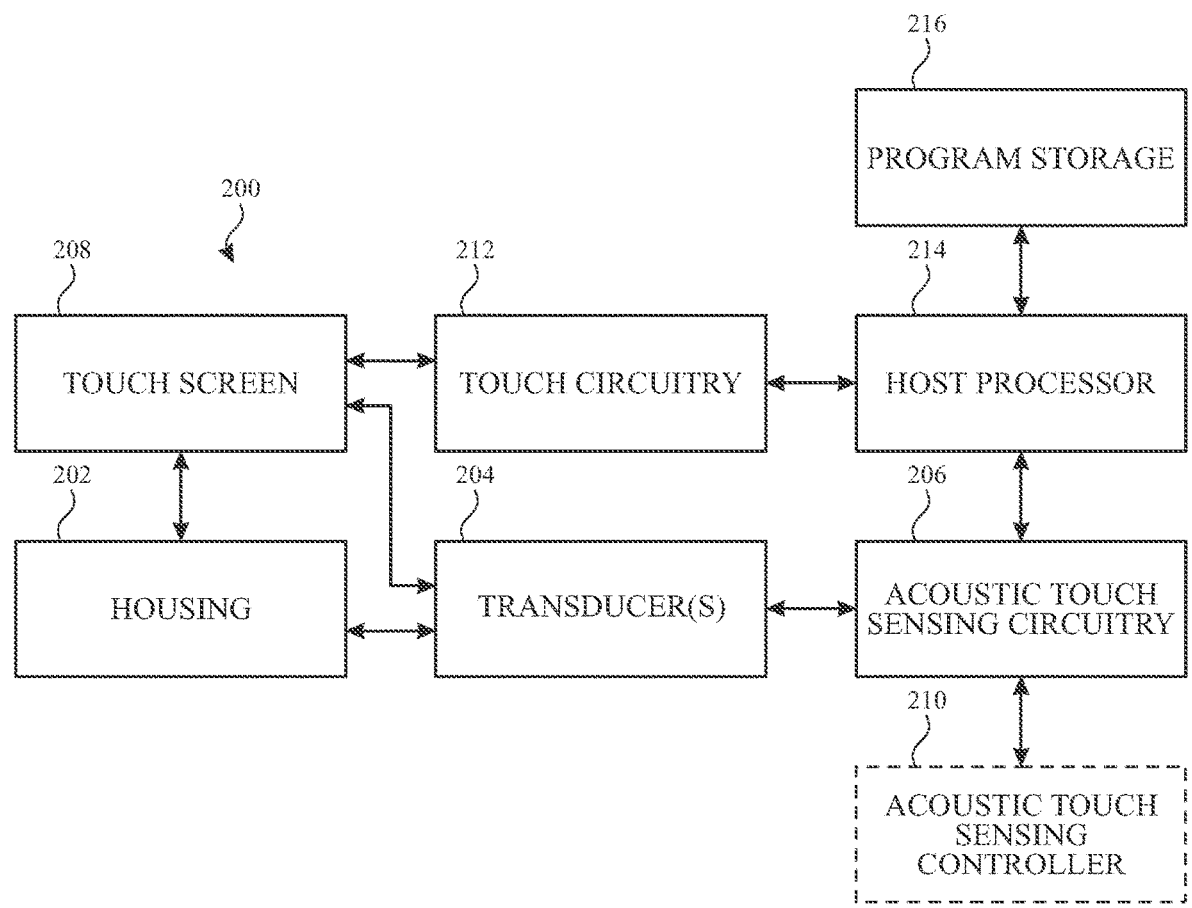
FIG. 2 illustrates an exemplary block diagram of an electronic device including an acoustic touch sensing system according to examples of the disclosure.

FIG. 2 illustrates an exemplary block diagram of an electronic device including an acoustic touch sensing system according to examples of the disclosure. In some examples, housing 202 of device 200 (which can correspond to mobile telephone 136, digital media player 140, personal computer 144, tablet computer 148, and wearable device 150 above) can be coupled (e.g., mechanically) with one or more acoustic transducers 204. In some examples, transducers 204 can be piezoelectric transducers, which can be made to vibrate by the application of electrical signals when acting as a transmitter, and generate electrical signals based on detected vibrations when acting as a receiver. In some examples, transducers 204 can be formed from a piezoelectric ceramic material (e.g., lead zirconate titanate (PZT) or potassium niobate perovskite compounds (KNN)), or a piezoelectric thin film (e.g., aluminum nitride, zinc oxide, etc.), or a piezoelectric plastic material (e.g., PVDF). Similarly, transducers 204 can produce electrical energy as an output when vibrated. In some examples, transducers 204 can be bonded to housing 202 by a bonding agent (e.g., a thin layer of stiff epoxy). In some examples, transducers 204 can be deposited on the surface through processes such as deposition, lithography, or the like. In some examples, transducers 204 can be bonded to the surface using conductive or non-conductive bonding materials. When electrical energy is applied to transducers 204 it can cause the transducers to vibrate, the surface material in contact with the transducers can also be caused to vibrate, and the vibrations of the molecules of the surface material can propagate as an acoustic wave through the surface material. In some examples, vibration of traducers 204 can be used to produce ultrasonic acoustic waves at a selected frequency over a broad frequency range (e.g., 100 kHz-10 MHz) in the medium of the surface of the electronic device which can be metal, plastic, glass, wood, or the like. It should be understood that other frequencies outside of the exemplary range above can be used while remaining within the scope of the present disclosure.

In some examples, transducers 204 can also be partially or completely disposed on (or coupled to) a portion of a touch screen 208. For example, touch screen 208 (e.g., capacitive) may include a glass panel (cover glass) or a plastic cover, and a display region of the touch screen may be surrounded by a non-display region (e.g., a black border region surrounding the periphery of the display region of touch screen). In some examples, transducers 204 can be disposed partially or completely in the black mask region of touch screen 208 glass panel (e.g., on the back side of the glass panel behind the black mask) such that the transducers are not visible (or are only partially visible) to a user. Some exemplary integrations of transducers and cover glass (and acoustic touch detection circuits) are described in U.S. patent application Ser. No. 15/663,588 filed Jul. 28, 2017

(Brian KING et al.), the disclosure of which is herein incorporated by reference in its entirety for all intended purposes.

Device 200 can further include acoustic touch sensing circuitry 206, which can include circuitry for driving electrical signals to stimulate vibration of transducers 204 (e.g., transmit circuitry), as well as circuitry for sensing electrical signals output by transducers 204 when the transducer is stimulated by received acoustic energy (e.g., receive circuitry). In some examples, timing operations for acoustic touch sensing circuitry 206 can optionally be provided by a separate acoustic touch sensing controller 210 that can control timing of operations by acoustic touch sensing circuitry 206. In some examples, touch sensing controller 210 can be coupled between acoustic touch sensing circuitry 206 and host processor 214. In some examples, controller functions can be integrated with acoustic touch sensing circuitry 206 (e.g., on a single integrated circuit). Output data from acoustic touch sensing circuitry 206 can be output to a host processor 214 for further processing to determine a location of an object contacting the device as will be described in more detail below. In some examples, the processing for determining location of a contacting object can be performed by acoustic touch sensing circuitry 206, acoustic touch sensing controller 210 or a separate sub-processor of device 200 (not shown).

In addition to acoustic touch sensing, device 200 can include additional touch circuitry 212 and optionally a touch controller (not shown) that can be coupled to the touch screen 208. In examples including a touch controller, the touch controller can be disposed between touch circuitry 212 and host processor 214. Touch circuitry 212 can, for example, be capacitive or resistive touch sensing circuitry, and can be used to detect contact and/or hovering of objects (e.g., fingers, styli) in contact with and/or in proximity to touch screen 208, particularly in the display region of the touch screen. Thus, device 200 can include multiple types of sensing circuitry (e.g., touch circuitry 212 and acoustic touch sensing circuitry 206) for detecting objects (and their positions) in different regions of the device and/or for different purposes, as will be described in more detail below. Although described herein as including a touch screen, it should be understood that touch circuitry 212 can be omitted, and in some examples, touch screen 208 can be replaced by an otherwise non-touch-sensitive display (e.g., but-for the acoustic sensors).

Host processor 214 can receive acoustic or other touch outputs (e.g., capacitive) and perform actions based on the touch outputs. Host processor 214 can also be connected to program storage 216 and touch screen 208. Host processor 214 can, for example, communicate with touch screen 208 to generate an image on touch screen 208, such as an image of a user interface (UI), and can use touch circuitry 212 and/or acoustic touch sensing circuitry 206 (and, in some examples, their respective controllers) to detect a touch on or near touch screen 208, such as a touch input to the displayed UI. The touch input can be used by computer programs stored in program storage 216 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 214 can also perform additional functions that may not be related to touch processing.

Note that one or more of the functions described herein can be performed by firmware stored in memory and executed by touch circuitry 212 and/or acoustic touch sensing circuitry 206 (or their respective controllers), or stored in program storage 216 and executed by host processor 214. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable medium storage can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, Universal Serial Bus (USB) memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

It is to be understood that device 200 is not limited to the components and configuration of FIG. 2, but can include other or additional components in multiple configurations according to various examples. Additionally, the components of device 200 can be included within a single device, or can be distributed between multiple devices. Additionally, it should be understood that the connections between the components is exemplary and different unidirectional or bidirectional connections can be included between the components depending on the implementation, irrespective of the arrows shown in the configuration of FIG. 2.

Figure 3A:
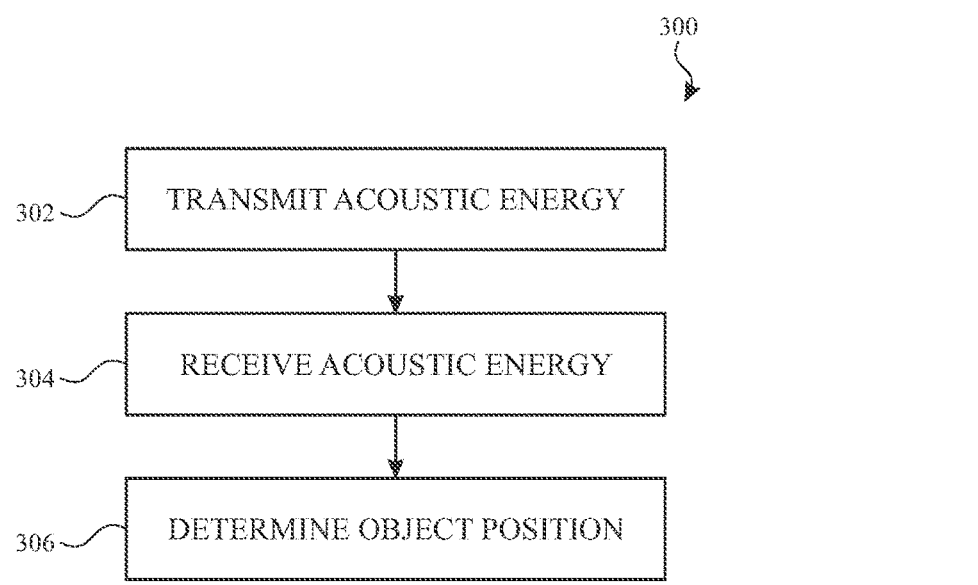
FIG. 3A illustrates an exemplary process for acoustic touch sensing of an object contact position according to examples of the disclosure.

FIG. 3A illustrates an exemplary process 300 for acoustic touch sensing of an object contact position according to examples of the disclosure. At 302, acoustic energy can be transmitted (e.g., by one or more transducers 204) along a surface and/or through the thickness of a device in the form of an ultrasonic wave, for example. In some examples, the wave can propagate as a compressive wave, a guided wave such as a shear horizontal wave, a Rayleigh wave, a Lamb wave, a Love wave, a Stonely wave, or a surface acoustic wave. Other propagation modes for the transmitted acoustic energy can also exist based on the properties of the surface material, geometry and the manner of energy transmission from the transducers to the surface of the device. In some examples, the surface can be formed from glass, plastic, or sapphire crystal (e.g., touch screen 208) or the surface can formed from metal, ceramics, plastic, or wood (e.g., housing 202). Transmitted energy can propagate along the surface and/or through the thickness until a discontinuity in the surface is reached (e.g., an object, such as a finger, in contact with the surface), which can cause a portion of the energy to reflect. In some examples, a discontinuity can occur at edges of the surface material (e.g., when the ultrasonic wave propagates to the edge of the surface opposite the transducer). When the transmitted energy reaches one of the discontinuities described above, some of the energy can be reflected, and a portion of the reflected energy can be directed to one or more transducers (e.g., transducers 204). In some examples, water or other fluids in contact with the surface of the device (e.g., device 200) will not act as a discontinuity to the acoustic waves, and thus the acoustic touch sensing process can be effective for detecting the presence of an object (e.g., a user's finger) even in the presence of water drops (or other low-viscosity fluids) on the surface of the device or even while the device is fully submerged.

At 304, returning acoustic energy can be received, and the acoustic energy can be converted to an electrical signal by one or more transducers (e.g., transducers 204).

At 306, the acoustic sensing system can determine whether one or more objects is contacting the surface of the device, and can further detect the position of one or more objects based on the received acoustic energy. In some examples, a distance of the object from the transmission source (e.g., transducers 204) can be determined from a time-of-flight between transmission and reception of reflected energy, and a propagation rate of the ultrasonic wave through the material. In some examples, baseline reflected energy from one or more intentionally included discontinuities (e.g., edges) can be compared to a measured value of reflected energy corresponding to the one or more discontinuities. The baseline reflected energy can be determined during a measurement when no object (e.g., finger) is in contact with the surface. Deviations of the reflected energy from the baseline can be correlated with a presence of an object touching the surface. Although process 300, as described above, generally refers to reflected waves received by the transducers that transmitted the waves, in some examples, the transmitter and receiver functions can be separated such that the transmission of acoustic energy at 302 and receiving acoustic energy at 304 may not occur at the same transducer. Exemplary device configurations and measurement timing examples that can be used to implement process 300 will be described in further detail below.

Figure 3B:
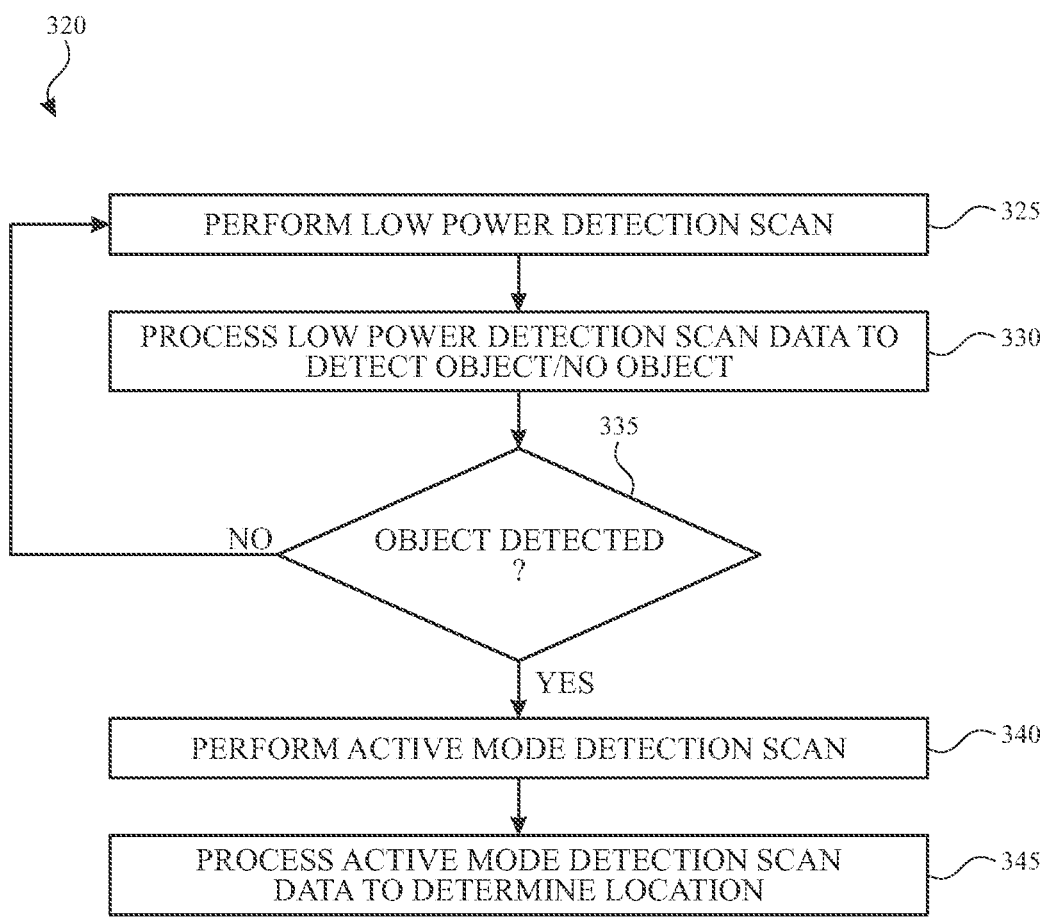
FIG. 3B illustrates an exemplary process for acoustic touch sensing of an object presence and contact position in various modes according to examples of the disclosure.

In some examples, the acoustic touch sensing can be performed differently in different operating modes. For example, the acoustic touch sensing can include a low power mode (e.g., when objects are not detected, when display is turned off) and an active mode (e.g., when an object is detected). FIG. 3B illustrates an exemplary process 320 for acoustic touch sensing of an object presence and contact position in various modes (e.g., a low power mode and an active mode) according to examples of the disclosure. At 325, the acoustic touch sensing system can perform a low power detection scan. In some examples, the low power detection scan can include sensing with fewer (in comparison to the active mode scan) of the transducers of the acoustic touch sensing system (e.g., four transducers may be used for the active mode detection scan as described below with respect to FIG. 5A, and fewer than four transducers may be used for the low power detection scan). In some examples, the acoustic touch sensing system can use a single transducer to transmit acoustic waves and receive reflections to determine the presence of an object touching. Additionally or alternatively, in some examples, the low power detection scan can include sensing energy or waves received by one or more transducers for a shorter (in comparison to the active mode scan) period of time. For example, the low power scan can sense the energy or waves for the period of time corresponding to a reflection of an opposite edge of the touch sensing surface (rather than for a period that may include other reflections). Attenuation in the reflected energy or wave corresponding to the opposite edge compared with a no-touch baseline of reflected energy or wave corresponding to the opposite edge can be an indication that an object is touching the surface. Additionally or alternatively, low power detection scan can be performed at a reduced frame rate (e.g., 10-30 Hz for the low power detection scans rather than 30-120 Hz for active mode detection scans), thereby reducing the power consumption by the various analog-to-digital converter (ADC) and digital-to-analog (DAC) components. At 330, the acoustic touch sensing system can process data from the low power detection scan and detect whether an object is or is not touching the surface. When no object is detected on the surface at 335, the acoustic touch sensing system can remain in a low power mode, and continue to perform low power detection scans (in the same or in subsequent scan frames). When an object is detected on the surface at 335, the acoustic touch sensing system can transition into an active mode and, at 340, perform an active mode detection scan. At 345, the data from the active mode detection scan can be processed to determine a location (e.g., centroid) of the object(s) contacting the surface (e.g., as described below with reference to FIG. 5A).

Although process 300 is described as a low power detection scan and an active mode detection scan, it should be understood that process 300 can generally provide a coarse detection scan (e.g., indicating the presence or absence of a touch) and a fine detection scan (e.g., indicating the location of the touch) without limiting the system to low power mode and/or active mode operation.

Figure 4:
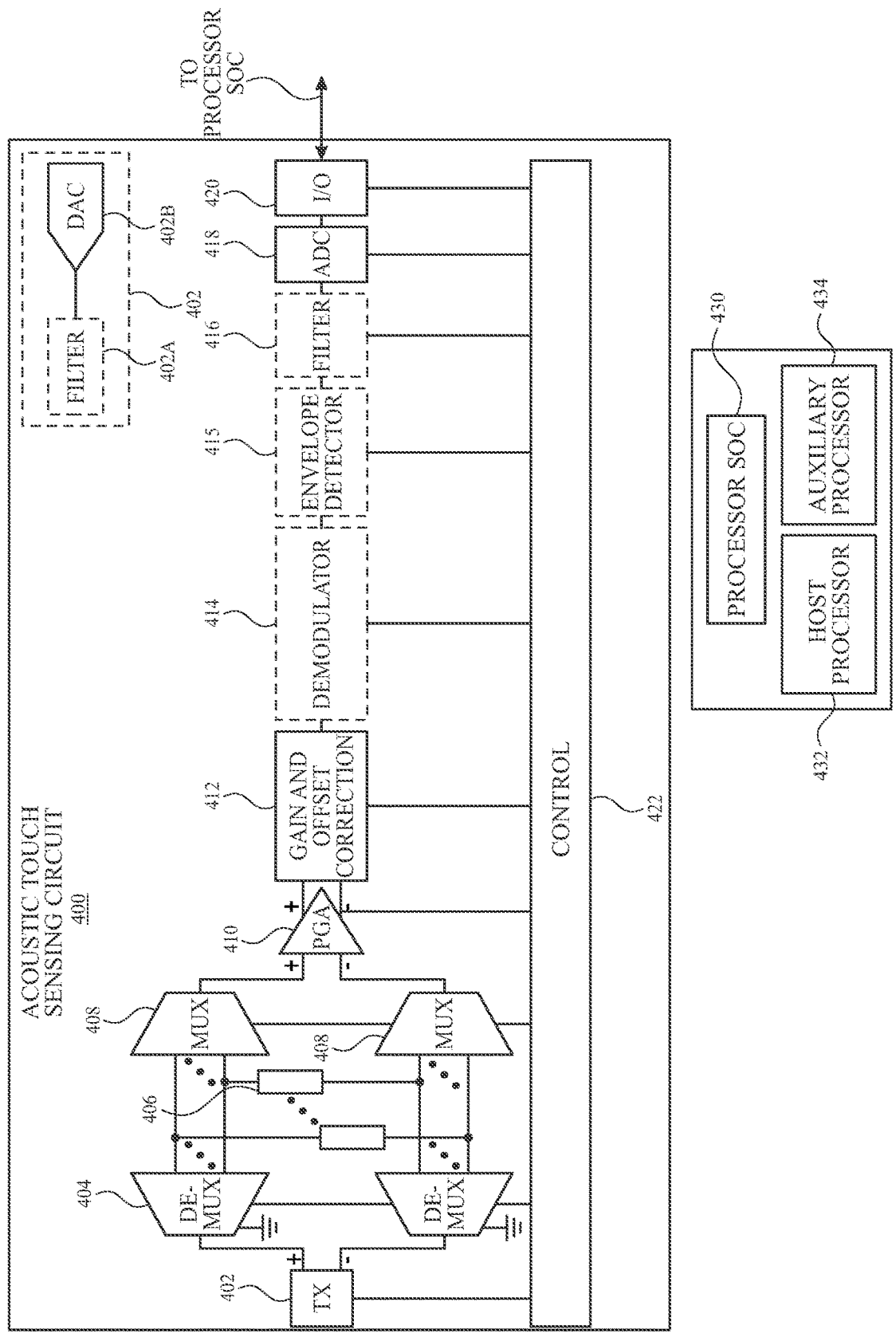
FIG. 4 illustrates an exemplary configuration of an acoustic touch sensing circuit according to examples of the disclosure.

FIG. 4 illustrates an exemplary configuration of an acoustic touch sensing circuit 400 according to examples of the disclosure. Acoustic touch sensing circuit 400 can include acoustic touch sensing circuitry 402-404 and 408-420 (which can correspond to acoustic touch sensing circuitry 206 above) and control circuit 422 (which can correspond to acoustic touch sensing controller 210 above). In some examples, acoustic touch sensing circuit 400 can also optionally include transducers 406 (which can correspond to transducers 204 above). In some examples, a transmitter 402 can generate an electrical signal for stimulating movement of one or more of a plurality of transducers 406. In some examples, the transmitted signal can be a differential signal, and in some examples, the transmitted signal can be a single-ended signal. In some examples, transmitter 402 can be a simple buffer, and the transmitted signal can be a pulse (or burst of pulses at a particular frequency). In some examples, transmitter 402 can include a digital-to-analog converter (DAC) 402A and optionally a filter 402B that can be used to smooth a quantized output of DAC 402A. In some examples, characteristics of the transducer itself can provide a filtering property and filter 402B can be omitted. DAC 402A can be used to generate an arbitrary transmit waveform. In some examples, the arbitrary waveform can pre-distort the transmit signal to equalize the channel. In some examples, the characteristics of each channel, such as the properties of the surface material coupled to transducers 406, the discontinuities in the surface material, and the reflection characteristics of an edge of the device can be measured and stored. In some examples, the channel characteristics can be measured as a manufacturing step (or factory calibration step), and in other examples the characteristics can be measured as a periodic calibration step (i.e., once a month, once a year, etc. depending on how quickly the channel characteristics are expected to change). In some examples, the channel characteristics can be converted to a transfer function of the channel, and the arbitrary transmit waveform can be configured using the inverse of the channel transfer function such that the returning signal is equalized (e.g., returning signal can be detected as a pulse or a burst of pulses despite the transmitted waveform having a seemingly arbitrary waveform). In some examples, a single differential pulse can be used as a transmit waveform. For example, a bipolar square pulse (where the voltage applied to the transducer can be both positive and negative) can be used as the transmit waveform, and the bipolar square pulse can be implemented using a single-ended or differential implementation.

Although not shown in FIG. 4, in some examples acoustic touch sensing circuit 400 can receive or generate a high voltage supply to enable high voltage stimulation of transducers. In some examples, the high voltage can be generated externally and supplied to acoustic touch sensing circuit 400. In some examples, acoustic touch sensing circuit 400 can include a voltage boosting circuit (e.g., a charge pump) to generate high voltages in acoustic touch sensing circuit 400.

A pair of demultiplexers 404 (e.g., in a differential implementation) can be used to selectively couple transmitter 402 to one of transducers 406 that can be the active transducer for a particular measurement step in a measurement cycle. In some examples, demultiplexers 404 can have a ground connection, and the non-selected demultiplexer outputs can be shorted, open, or grounded. As described above, transducers 406 can also generate output electrical signals when motion is induced in the transducers by acoustic energy. A pair of multiplexers 408 (e.g., in a differential implementation) can be used to select a transducer 406 for coupling to a programmable gain amplifier 410 configured to amplify the received signals. In some examples, the same transducer 406 can be coupled to transmitter 402 by demultiplexers 404 during the drive mode and coupled to programmable gain amplifier 410 by multiplexers 408 during the receive mode. Thus, a single transducer 406 can be used both for transmitting and receiving acoustic energy. In some examples, a first transducer can be coupled to transmitter 402 by demultiplexers 404 and a second transducer can be coupled by multiplexers 408 to programmable gain amplifier 410. For example, the transmitting transducer and the receiving transducer can be discrete piezoelectric elements, where the transmitting transducer can be designed for being driven by higher voltages (or currents) to produce sufficient motion in transducer 406 to generate an acoustic wave in the surface of a device (e.g., device 200 above), and the receiving transducer can be designed for receiving smaller amplitude reflected energy. In such an architecture, the transmit side circuitry (e.g., 402 and 404) can be optionally implemented on a high voltage circuit, and the receive side circuitry (e.g., 408-420) can be optionally implemented on a separate low voltage circuit. In some examples, multiplexers 408 can also be implemented on the high voltage circuit to properly isolate the remaining receive side circuitry (e.g., 410-420) during transmission operations by transmit side circuitry. Additionally or alternatively, in some examples, the transmit circuit can include an energy recovery architecture that can be used to recover some of the energy required for charging and discharging the transducer. In some examples, the programmable gain amplifier output can be coupled to gain and offset correction circuit 412. It should be understood that for a single-ended implementation, a single demultiplexer 404 and a single multiplexer 408 can be used, and transmitter 402, programmable gain amplifier 410, and the input to gain and offset correction circuit 412 can be single-ended as well. Differential implementations, however, can provide improved noise suppression over a single-ended implementation.

In some examples, the acoustic touch sensing circuit can be used in a system include multiple transmit transducers and one receive transducer. In such examples, demultiplexer 404 can be unnecessary and omitted from the acoustic touch sensing circuit. In some examples, the acoustic touch sensing circuit can be used in a system including multiple receive transducers and one transmit transducer. In such examples, multiplexer 408 can be unnecessary and omitted from the acoustic touch sensing circuit.

In some examples, the output of gain and offset correction circuit 412 can optionally be coupled to one or more analog processing circuits. In some examples, the output of gain and offset correction circuit 412 can be coupled to a demodulation circuit 414 configured to demodulate the received signals (e.g., by I/Q demodulation). In some examples, the output of the gain and offset correction circuit 412 can be coupled to an envelope detection circuit 415 configured to perform envelope detection on the received signals. In some examples, the output of gain and offset correction circuit 412 can be filtered at filter 416. In some examples, these blocks can be placed in a different order. In some examples, the processing of these analog processing circuits can be performed in the digital domain.

The received signals, whether raw or processed by one or more of demodulation circuit 414, envelope detection circuit 415 or filter 416 can be passed to an analog-to-digital converter (ADC) 418 for conversion to a digital signal. In some examples, an input/output (I/O) circuit 420 can be used to transmit received data for processing. In some examples, the output of I/O circuit 420 can be transferred to a host processor of the device, or to an auxiliary processor (sub-processor) separate from the host processor. For example, as illustrated, the output of I/O circuit 420 can be coupled to a processor system-on-chip (SoC) 430, which can include one or more processors. In some examples, processor SoC 430 can include a host processor 432 (e.g., an active mode processor) and an auxiliary processor 434 (e.g., a low power processor). In some examples, some or all of the digital signal processing can be performed (e.g., by acoustic touch sensing circuit 400) before transmitting the data to one or more other processors in the system (e.g., processor SoC 430). A control circuit 422 (e.g., a programmable logic circuit) can be used to control timing and operations of the acoustic touch sensing circuitry 402-420. In some examples, the I/O circuit is not only used for data transfer to processor SoC 430 (e.g., host processor 432), but also is used for writing the control registers and/or firmware download from processor SoC 430.

Processing data from acoustic touch detection scans can be performed by different processing circuits of an acoustic touch sensing system. For example, auxiliary processor 434 can be a low power processor that can remain active even when host processor 432 may be idle and/or powered down. In some examples, auxiliary processor 434 can received acoustic touch data in a low-power mode (e.g., from performing a low-power scan), and process the acoustic touch data to determine the presence or absence of an object touching the sensing surface. Once an object is detected touching the sensing surface, the system can transition from the low-power mode to an active mode, and acoustic touch data (e.g., from performing active mode scans) can be processed by auxiliary processor 434 to determine the location of the object. Host processor 432 can receive the location of the object touching the surface from auxiliary processor 434 and perform an action based thereon. In some examples, acoustic touch sensing circuit 400 can perform some processing (e.g., averaging, data compression, etc.) before sending acoustic touch data to auxiliary processor 434 (and/or host processor 432). In some examples, the auxiliary processor can process acoustic touch data from a low-power scan and the host processor can process acoustic touch data from active mode scans. In some examples, the host processor can process acoustic touch data from both low-power scans and active mode scans. In some examples, acoustic touch sensing circuit 400 can include a dedicated acoustic touch digital signal processor (DSP) to process acoustic touch data from low-power scans and/or active mode scans. The results of the processing by the DSP can be sent to processor SoC 430.

It is to be understood that the configuration of FIG. 4 is not limited to the components and configuration of FIG. 4, but can include other or additional components in multiple configurations according to various examples. Additionally, some or all of the components 402-404 and 408-420 can be included in a single circuit, or can be divided among multiple circuits while remaining within the scope of the examples of the disclosure.

Figure 5A:
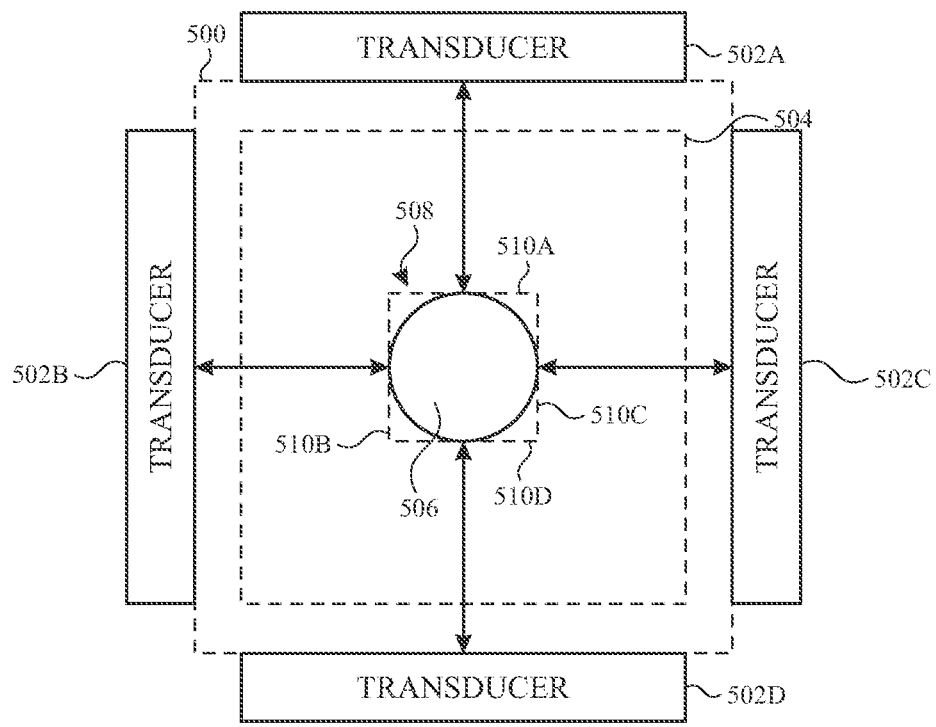
FIGS. 5A-5F illustrate exemplary system configurations and timing diagrams for acoustic touch sensing to determine position using a bounding box technique according to examples of the disclosure.

As described herein, various acoustic sensing techniques can be used to determine position of an object in touching a surface. In some examples, one or more time-of-flight (TOF) measurements can be performed using one or more acoustic transducers to determine boundaries of the position that the object is touching. FIGS. 5A-5F illustrate exemplary system configurations and timing diagrams for acoustic touch sensing to determine position using a bounding box technique according to examples of the disclosure. FIG. 5A illustrates an exemplary acoustic touch sensing system configuration using four acoustic transducers 502A-D mounted along (or otherwise coupled to) four edges of a surface 500 (e.g., cover glass). Transducers 502A-D can be configured to generate acoustic waves (e.g., shear horizontal waves) and to receive the reflected acoustic waves. Propagation of shear horizontal waves can be unaffected by water on surface 500 because low viscosity fluids and gases (such as water and air) have a very low shear modulus, and therefore do not perturb the boundary conditions that affect wave propagation. Shear horizontal waves can be highly directional waves such that the active detection region (or active area) 504 can be effectively defined based on the position and dimensions of the acoustic transducers 502A-D. It should be understood, however, that active area can change based on the directionality property of the acoustic waves and the size and placement of acoustic transducers 502A-D. Additionally, it should be understood that although illustrated as transmit and receive transducers, in some examples, the transmit and receive functions can be divided (e.g., between two transducers in proximity to one another, rather than one transmit and receive transducer).

The position of a touch 506 from an object in contact with surface 500 can be determined by calculating TOF measurements in a measurement cycle using each of acoustic transducers 502A-D. For example, in a first measurement step of the measurement cycle, acoustic transducer 502A can transmit an acoustic wave and receive reflections from the acoustic wave. When no object is present, the received reflection will be the reflection from the acoustic wave reaching the opposite edge of surface 500. However, when an object is touching surface 500 (e.g., corresponding to touch 506), a reflection corresponding to the object can be received before receiving the reflection from the opposite edge. Based on the received reflection corresponding to the object received at transducer 502A, the system can determine a distance to the edge (e.g., leading edge) of touch 506, marked by boundary line 510A. Similar measurements can be performed by transducers 502B, 502C and 502D to determine a distance to the remaining edges of touch 506, indicated by boundary lines 510B, 510C and 510D. Taken together, the measured distances as represented by boundary lines 510A-510D can form a bounding box 508. In some examples, based on the bounding box, the acoustic touch sensing system can determine the area of the touch (e.g., the area of the bounding box). Based on the bounding box, the acoustic touch sensing system can determine position of touch 506 (e.g., based on a centroid and/or area of the bounding box).

The acoustic touch sensing scan described with reference to FIG. 5A can correspond to the active mode detection scan, described above with reference to FIG. 3B, that can be used to determine the position/location of an object touching the surface.

Figure 5B:
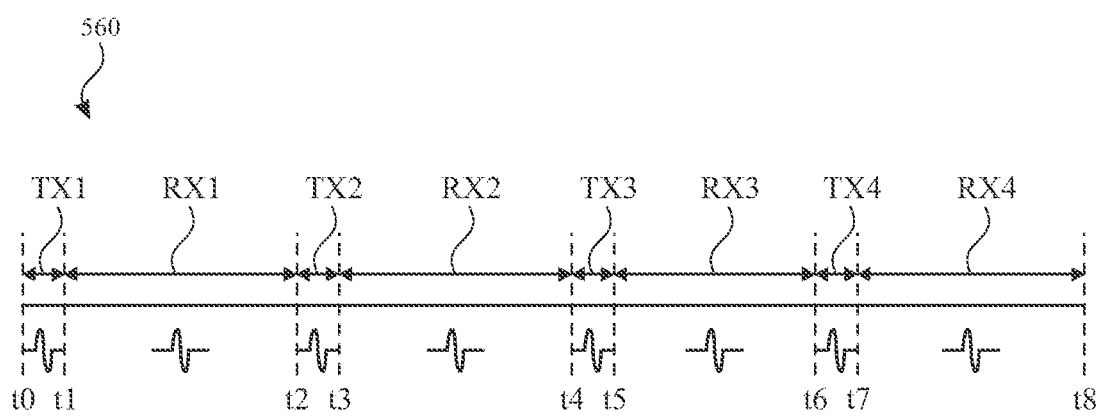

FIG. 5B illustrates an exemplary timing diagram 560 for an acoustic touch sensing scan described in FIG. 5A according to examples of the disclosure. As illustrated in FIG. 5B, each of the transducers can transmit acoustic waves and then receive reflected waves in a series of measurement steps. For example, from t0 to t1 a first transducer (e.g., acoustic transducer 502A) can be stimulated, and reflections at the first transducer can be received from t1 to t2. From t2 to t3 a second transducer (e.g., acoustic transducer 502B) can be stimulated, and reflections at the second transducer can be received from t3 to t4. From t4 to t5 a third transducer (e.g., acoustic transducer 502C) can be stimulated, and reflections at the third transducer can be received from t5 to t6. From t6 to t7 a fourth transducer (e.g., acoustic transducer 502D) can be stimulated, and reflections at the fourth transducer can be received from t7 to t8. Although the transmit (Tx) and receive (Rx) functions are shown back-to-back in FIG. 5B for each transducer, in some examples, gaps can be included between Tx and Rx functions for a transducer (e.g., to minimize capturing portions of the transmitted wave at the receiver), and or between the Tx/Rx functions of two different transducers (such that acoustic energy and the transients caused by multiple reflections from a scan by one transducer does not impact a scan by a second transducer). In some examples, unused transducers can be grounded (e.g., by multiplexers/demultiplexers).

Figure 5C:
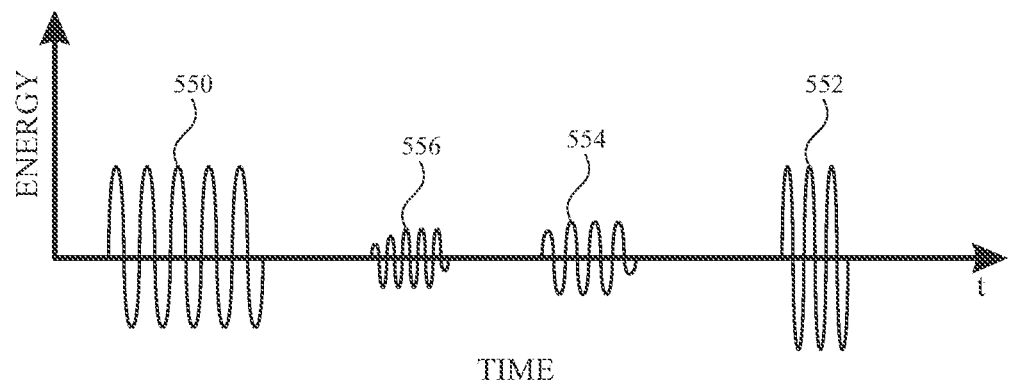

The distance between an object touching the surface and a transducer can be calculated based on TOF principles. The acoustic energy received by transducers can be used to determine a timing parameter indicative of a leading edge of a touch. The propagation rate of the acoustic wave through the material forming the surface can be a known relationship between distance and time. Taken together, the known relationship between distance and time and the timing parameter can be used to determine distance. FIG. 5C illustrates an exemplary timing diagram according to examples of the disclosure. FIG. 5C illustrates the transducer energy output versus time. Signal 550 can correspond to the acoustic energy at the transducer from the generation of the acoustic wave at a first edge of the surface. Signal 552 can correspond to the acoustic energy at the transducer received from the wave reflected off of a second edge opposite the first edge of the surface. Due to the known distance across the surface from the first edge to the opposite the second edge and the known or measured propagation rate of the acoustic signal, the reflection off of the opposite edge of the surface occurs at a known time. Additionally, one or more objects (e.g., fingers) touching the surface can cause reflections of energy in the time between the generation of the wave and the edge reflection (i.e., between signals 550 and 552). For example, signals 556 and 554 can correspond to reflections of two objects touching the surface (or a leading and trailing edge of one object). It should be understood that signals 550-556 are exemplary and the actual shape of the energy received can be different in practice.

In some examples, the timing parameter can be a moment in time that can be derived from the reflected energy. For example, the time can refer to that time at which a threshold amplitude of a packet of the reflected energy is detected. In some examples, rather than a threshold amplitude, a threshold energy of the packet of reflected energy can be detected, and the time can refer to that time at which a threshold energy of the packet is detected. The threshold amplitude or threshold energy can indicate the leading edge of the object in contact with the surface. In some examples, the timing parameter can be a time range rather than a point in time. To improve the resolution of a TOF-based sensing scheme, the frequency of the ultrasonic wave and sampling rate of the receivers can be increased (e.g., so that receipt of the reflected wave can be localized to a narrower peak that can be more accurately correlated with a moment in time).

In some examples, transducers 502A-D can operate in a time multiplexed manner, such that each transducer transmits and receives an acoustic wave at a different time during a measurement cycle so that the waves from one transducer do not interfere with waves from another transducer. In other examples, the transducers can operate in parallel or partially in parallel in time. The signals from the respective transducers can then be distinguished based on different characteristics of the signals (e.g., different frequencies, phases and/or amplitudes).

Figure 5D:
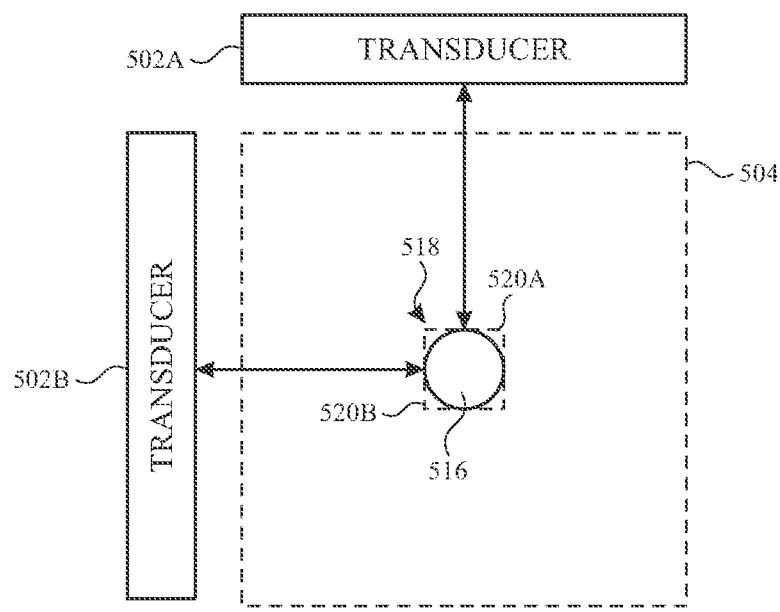

Although four transducers are illustrated in FIG. 5A, in some examples, fewer transducers can be used. For example, when using an input object with known dimensions, as few as two transducers can be used. FIG. 5D illustrates an exemplary acoustic touch sensing system configuration using two acoustic transducers 502A and 50B mounted along two perpendicular edges (e.g., one horizontal edge and one vertical edge) of a surface 500 (surface 500 is omitted for clarity of illustration). An object in contact within the active area 504 of the surface (represented by touch 516) can be an object with known dimensions. For example, a stylus tip can have a known size and shape (e.g., a diameter of 1-2 mm). As described above with respect to FIG. 5A, a first distance illustrated by boundary line 520A can be measured by the TOF of an acoustic wave transmitted and received by transducer 502A, and a second distance illustrated by boundary line 520B can be measured by the TOF of an acoustic wave transmitted and received by transducer 502B. Based on the known dimensions of object, bounding box 518 can be formed (e.g., by adding the diameter of object to the first and second distances). Based on the bounding box, the acoustic touch sensing system can determine position of touch 516 (e.g., based on a centroid). In some examples, the position can be determined based on the two measured distances without requiring forming the bounding box (e.g., the position estimating algorithm can use the dimensions of the object and the two measured distances to calculate the centroid).

In some examples, a user's finger(s) can be characterized such that a two transducer scheme can be used to detect touches by one or more fingers. In some examples, user input can be primarily from an index finger. The user's index finger can be characterized (e.g., dimensions or size) and the bounding box scheme can be applied using two TOF measurements and the finger characteristics. In some examples, multiple fingers can be characterized. During operation, the finger(s) can be identified and then the characteristics of the identified finger(s) can be used with two TOF measurements to determine position.

Figure 5E:
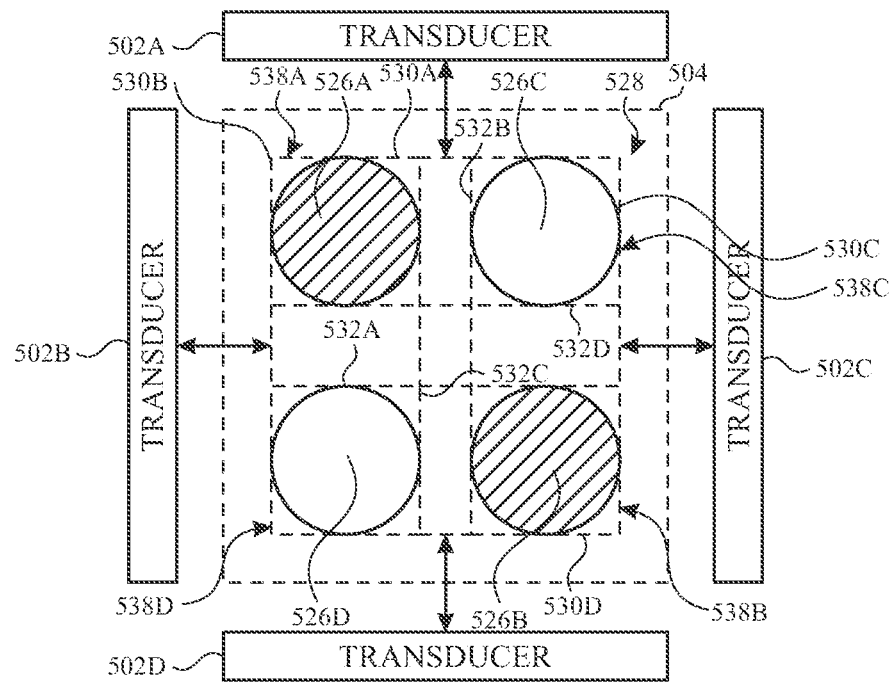

FIGS. 5A and 5D illustrate detection of a single object. In some examples, however, the acoustic touch sensing system can be configured to detect multiple touches. FIG. 5E illustrates an exemplary acoustic touch sensing system configuration configured to detect multiple touches. The acoustic touch sensing system can include four acoustic transducers 502A-502D and an active area 504 as described above with respect to FIG. 5A. Instead of one object touching within active area 504, in FIG. 5E two objects can be touching within the active area 504. The two objects, however, can create an ambiguity in the acoustic touch sensing system regarding the positions of the two objects. The two objects can correspond to either touches 526A and 526B or to touches 526C and 526D. Two of the touches can be actual touches and the other two of the touches can be phantom touches.

For example, TOF measurements can be performed by using transducers 502A, 502B, 502C and 502D to determine a distance to the two objects. For example, transducer 502A can receive two packets of reflected acoustic energy corresponding to the two objects (e.g., as illustrated in FIG. 5C, for example). A first TOF distance to the edge of either touch 526A or touch 526C can be marked by boundary line 530A, and a second TOF distance to the edge of either touch 526B or touch 526D can be marked by boundary line 532A. Likewise, transducer 502B can be used to determine a boundary line 530B corresponding to touch 526A or touch 526D, and a boundary line 532B corresponding to touch 526B or touch 526C. Transducer 502C can be used to determine a boundary line 530C corresponding to touch 526B or touch 526C, and a boundary line 532C corresponding to touch 526A or touch 526D. Transducer 502D can be used to determine a boundary line 530D corresponding to touch 526B or touch 526D, and a boundary line 532D corresponding to touch 526A or touch 526C. Taken together, boundary lines 530A-D and 532A-D can form bounding boxes 538A-D. For example, bounding box 538A can be formed from boundary lines 530A, 530B, 532C and 532D. Similarly, bounding box 538D can be formed from boundary lines 532A, 530B, 532C and 530D.

In some examples, the two actual touches can be disambiguated when they are sequential. The first touch can be registered and then the second sequential touch can be disambiguated based on the first touch. For example, in the example illustrated in FIG. 5E, if touch 526A is detected first, then in the subsequent measurement cycle the two touches can be determined to be touches 526A and 526B. In contrast, if touch 526C is detected first, then in the subsequent measurement cycle the two touches can be determined to be touches 526C and 526D. As long as the touches remain far enough apart to be resolved into separate bounding boxes (and assuming the touch contact moves only small amounts between each measurement interval), the two touches can be tracked. In practice, the apparently simultaneous multi-touch by a user can be viewed as sequential touches if the acquisition time (measurement cycle) of the acoustic sensors is short enough to register the sequence. Thus, if the measurement cycle repeats frequently enough, the acoustic touch sensing system can disambiguate the multiple touches with four transducers.

In some examples, e.g., when multiple touches cannot be resolved, bounding box 528 can be used to determine the position of touch. Bounding box 528 can be formed from boundary lines 530A-D.

Figure 5F:
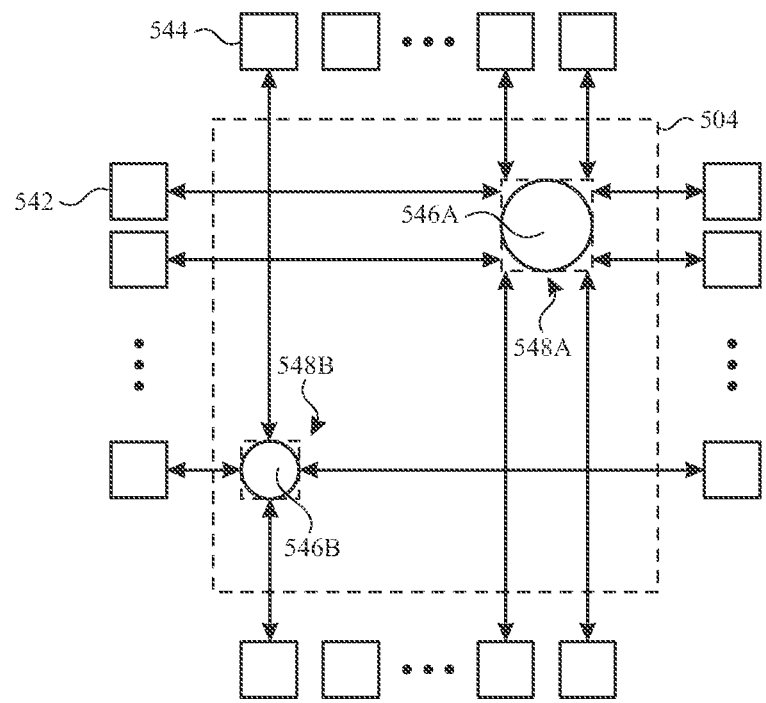

The multi-touch capabilities described with reference to FIG. 5E can be limited based on the disambiguation requirements (e.g., sequential contact and tracking). In some examples, multi-touch capabilities can be provided by increasing the number of transducers in the system. FIG. 5F illustrates an exemplary acoustic touch sensing system configuration configured to detect multiple touches. The acoustic touch sensing system in FIG. 5F can include one or more transducers 542 and 544 arranged along edges of the surface and forming active area 504. Each of the transducers 542 and 544 can transmit acoustic waves and measure the reflections to determine the presence and location of one or more objects. For example, as illustrated, bounding box 548A can be formed around touch 546A based on TOF measurements from eights transmitters, and bounding box 548B can formed around touch 546B based on TOF measurements from four of the transmitters. Multiple transducers can also be implemented in place of the two transducers illustrated in FIG. 5D.

In some examples, the arrangement of multiple transducers illustrated in FIG. 5F can be implemented without the multi-touch capability described with respect to FIG. 5F. Instead, the multiple transducers on each of the sides can be coupled together and can act as a single transducer on each of the four sides as described with reference to FIGS. 5A and 5E (or on two sides as described with reference to FIG. 5D).

TOF schemes described with reference to FIGS. 5A-5F can provide for touch sensing capability using a limited number of transducers (e.g., as compared with capacitive touch sensing) which can simplify the transmitting and receiving electronics, and can reduce time and memory requirements for processing. Although FIGS. 5A-5F discuss using a bounding box based on TOF measurements to determine position of an object, in other examples, different methods can be used, including applying matched filtering to a known transmitted ultrasonic pulse shape, and using a center of mass calculation on the filtered output (e.g., instead of a centroid). Additionally, although touch sensing is primarily described, the acoustic transducers can additionally or alternatively be used for force sensing.

Referring back to FIG. 5A, the acoustic touch sensing system configuration can use four separate acoustic transducers 502A-D mounted to four edges of a surface 500. The four separate acoustic transducers, however, may leave portions of the surface 500 outside of active area 504 without touch sensing capabilities. Additionally, the rectangular (linear) shaped transducers as shown in FIG. 5A may be suitable for a rectangular or square (linear) surface 500, but rectangular (linear) shaped transducers may be less suitable or unsuitable for a surface with curves. As described below, in some examples, a transducer with a curved shape can be used to improve the integration of transducers with curved surfaces and/or to expand the active area of a touch surface with curves. In particular, piezoelectric material with curves can be used to expand sensing coverage for a planar waveguide with a curved shape (e.g., cover glass with a partially circular or circular shape). The transducers formed from a piezoelectric material with curves can be operated in a similar manner as transducers 502A-D of FIG. 5A, and further description of their operation is omitted.

In the example of FIG. 5A, the exemplary acoustic touch sensing system configuration was shown with four acoustic transducers 502A-D mounted along (or otherwise coupled to) four edges of a surface 500 (e.g., cover glass). However, in some examples, one or more transducers for an acoustic touch sensing system can be fabricated and integrated using a mechanically integrated structure including multiple acoustic transducers. For example, a single structure (e.g., an annular structure, such as a ring or loop) including one or more piezoelectric segments can be fabricated and the single structure can be coupled to (e.g., adhered with an adhesive) a surface (e.g., a front crystal/cover glass). A single structure can simplify the structural integration of the device (e.g., one fabrication step to couple multiple transducers to the surface), can provide a mechanically reliable and stable structure for improved structural integrity of the system, and can provide for improved water sealing for a waterproof or water resistant device. In some examples, the single structure with one or more piezoelectric segments can be prefabricated as a closed loop in the shape of a touch sensitive surface of a device in which it may be integrated (e.g., mobile telephone 136, tablet computer 148 or wearable device 150, etc.) and then integrated into the device in one assembly step instead of adding each transducer individually. The process of decoupling of the manufacture of this single structure (also referred to herein as "annular structure," "piezoelectric structure" or "annular piezoelectric structure") from the rest of the device can allow for mass production of the piezoelectric structure and can improve the manufacturing yield. For example, in some examples, the piezoelectric structure can be tested separately, and only then bonded to the rest of the device to improve the yield.

Although described above primarily as a single, closed and curved structure (e.g., an annular structure), it should be understood that in other examples, the acoustic touch sensing system configuration can include multiple transducers formed from multiple structures (rather than a single structure) and/or in an open configuration (rather than a closed structure) and/or without curves (e.g., with linear segments as shown in FIG. 5A).

Figure 6A:
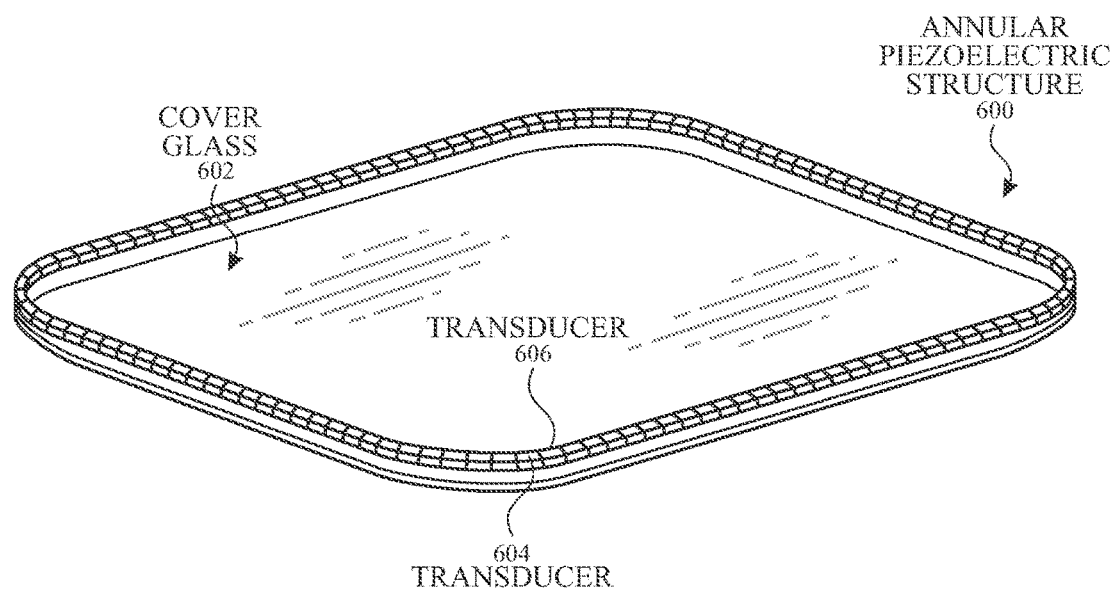
FIGS. 6A and 6B illustrate two views of an exemplary structure according to examples of the disclosure.
Figure 6B:
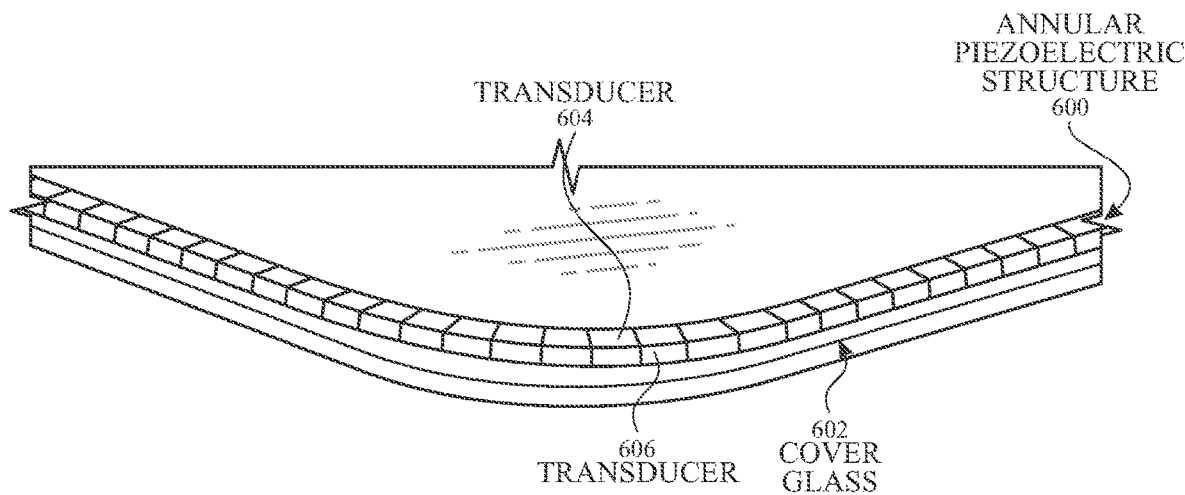

FIGS. 6A and 6B illustrate two views of an exemplary structure according to examples of the disclosure. For example, FIG. 6A illustrates a view of an exemplary annular piezoelectric structure 600 that can be used to implement one or more acoustic transducers according to examples of the disclosure. FIG. 6A also shows the coupling of the annular piezoelectric structure 600 to edges of cover glass/front crystal 602. In some examples, a display (not show in FIG. 6A) can be disposed and coupled beneath cover glass/front crystal 602 in the hollow area of annular piezoelectric structure 600. Annular piezoelectric structure 600 can have a shape similar to that of the touch sensitive surface of the device in which it may be integrated (e.g., mobile telephone 136, tablet computer 148 or wearable device 150, etc.). For example, annular piezoelectric structure 600 can be largely linear along its four sides, but can include curved corners (e.g., four elbow shaped curves) that match the shape of the cover glass/front crystal (e.g., a rectangular shape with curved corners). In some examples, the dimensions of annular piezoelectric structure 600 can be substantially the same (e.g., within a threshold, and subject to assembly constraints of the device) as the dimensions of the cover glass 602 of the devices or the same as the dimensions of the touch screen of the device (within a threshold of the size/dimensions of the device/touch screen).

FIG. 6B shows a partial and zoomed-in view of an exemplary annular piezoelectric structure 600 that can be used to implement one or more acoustic transducers according to examples of the disclosure. FIG. 6B also shows the coupling of the annular piezoelectric structure 600 to cover glass/front crystal 602. Although, annular piezoelectric structure 600 is formed from a single, continuous piezoelectric material, multiple transducers can be formed, as illustrated in FIGS. 6A and 6B (e.g., by transducers 604, 606) from sections of the piezoelectric material by patterning electrodes on piezoelectric structure 600 without requiring discrete piezoelectric segments for each transducer. Further detail of the electrode patterning for an annular piezoelectric structure is described below with respect to FIGS. 8-10.

The number of transducers formed for the annular piezoelectric structure 600 may vary depending on the application. The number of transducers may be limited by the minimum size of the transducer and the size of the annular piezoelectric structure. In some examples, annular piezoelectric structure 600 can be patterned with electrodes to form transducers of equal size. In some examples, annular piezoelectric structure 600 can be patterned with electrodes to form transducers of different sizes. In some examples, four transducers—similar to transducers 502A-D—can be formed by patterning electrodes on top and bottom of correspondingly located linear sections of annular piezoelectric structure 600. In some examples, in additional to transducers 502A-D, and electrodes can be patterned on top and bottom of the curved sections of annular piezoelectric structure 600 to additionally form four transducers at the elbows of annular piezoelectric structure 600.

Figure 7A:
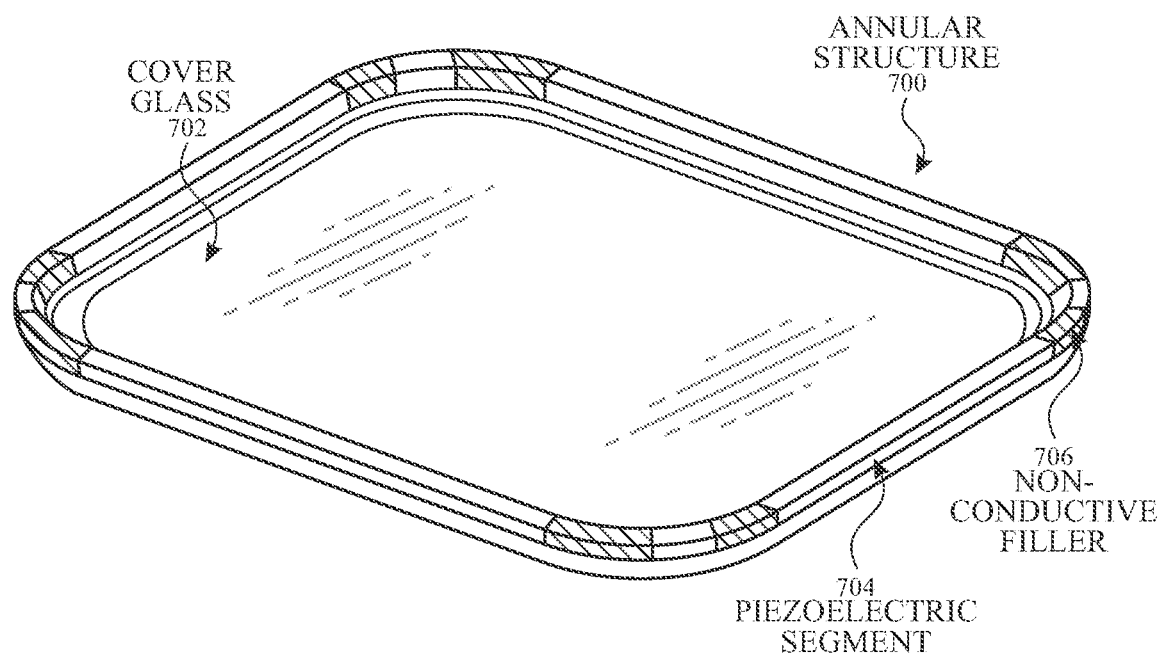
FIGS. 7A and 7B illustrate two views of an exemplary structure according to examples of the disclosure.
Figure 7B:
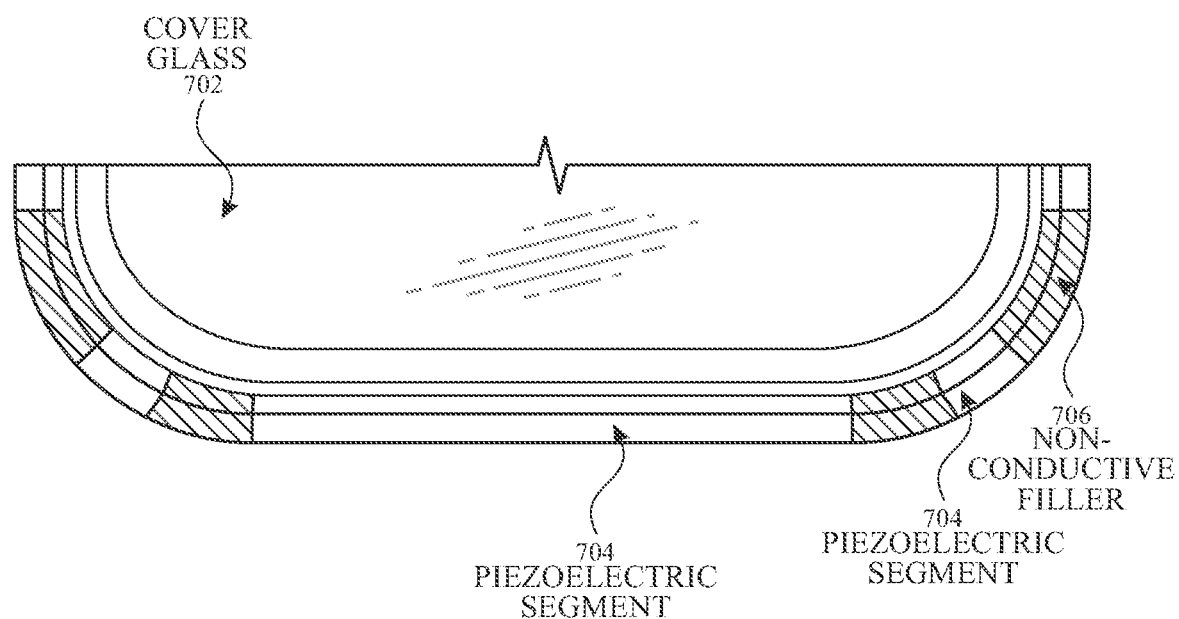

FIGS. 7A and 7B illustrate two views of an exemplary structure according to examples of the disclosure. For example, FIG. 7A illustrates a view of an exemplary annular structure 700 with discrete piezoelectric segments 704 that can be used to implement a plurality of acoustic transducers according to examples of the disclosure. In some examples, as shown in the example of FIG. 5A, the exemplary annular structure can be composed of four separate segments of piezoelectric material to form four acoustic transducers (e.g., as shown in FIG. 5A with four acoustic transducers 502A-D mounted along or otherwise coupled to four edges of a surface 500). In some examples, as shown in FIG. 7A, the exemplary annular structure can be composed of eight discrete piezoelectric segments 704, including four segments along the linear edges of annular structure 700 and the other four segments along the curved edges forming the corners of annular structure 700. In some examples, as shown in FIG. 7A, annular structure 700 can be formed by disposing a non-conductive material in the gaps between the piezoelectric segments 704. For example, a non-conductive material (e.g., epoxy) can be filled in between the piezoelectric segments (e.g., by injection molding). Although the non-conductive filler 706 is shown filling in the gaps between piezoelectric segments 704 in FIG. 7A, in some examples, the non-conductive filler can optionally cover other surfaces of piezoelectric segments 704 (e.g. by injection molding of the filler around the piezoelectric segments). For example, as shown below with respect to cross-sections of the structures shown in FIGS. 9-15, filler material can included on the sides of the piezoelectric segments and/or below the piezoelectric segments. In some examples, the filler material can encapsulate (or partially encapsulate) the piezoelectric segments and its corresponding electrodes to protect the transducers from environmental degradation (e.g., corrosion).

FIG. 7A also shows the coupling of annular structure 700 to edges of cover glass/front crystal 702. In some examples, a display (not show in FIG. 7A) can be disposed and coupled beneath cover glass/front crystal 702 in the hollow area of annular structure 700. Annular structure 700 can have a shape similar to that of the touch sensitive surface of the device to which it may be coupled (e.g., mobile telephone 136, tablet computer 148 or wearable device 150, etc.). For example, annular structure 700 can be largely linear along its four sides, but can include curved corners (e.g., four elbow shaped curves) that match the shape of the cover glass/front crystal (e.g., a rectangular shape with curved corners). In some examples, the dimensions of annular structure 700 can be substantially the same (e.g., within a threshold, and subject to assembly constraints of the device) as the dimensions of the cover glass 702 of the devices or the same as the dimensions of the touch screen of the device (within a threshold of the size/dimensions of the device/touch screen).

FIG. 7B shows a partial and zoomed-in view of an exemplary annular structure 700 that can be used to implement a plurality of acoustic transducers according to examples of the disclosure. FIG. 7B also shows the coupling of the annular structure 700 to cover glass/front crystal 702. In some examples, as shown in FIGS. 7A and 7B, each of the eight discrete piezoelectric segments 704 can be patterned with electrodes (e.g., one top electrode and one bottom electrode for each piezoelectric segment) and can form a separate acoustic transducer. In some examples, multiple acoustic transducers can be formed from one or more of the discrete piezoelectric segments 704 by patterning electrodes on the one or more segments. Further detail of the electrode patterning for a piezoelectric segment is described below with respect to FIGS. 8-10.

As with annular structure 600, the number of transducers formed for annular structure 700 may vary depending on the application. In some examples, each piezoelectric segment forms a separate acoustic transducer (e.g., eight transducers shown in FIG. 7A). In some examples, fewer (e.g., four) or more segments (e.g., 10) can be included. In some examples, the piezoelectric segments can be the same size. In some examples, the piezoelectric segments can be different sizes (and shapes). For example, in FIG. 7A, the linear piezoelectric segments may be longer than the curved piezoelectric segments. In some examples, more transducers can be created than the number of piezoelectric segments by the patterning of electrodes on one or more of the piezoelectric segments. The number of transducers may be limited by the minimum size of the transducer and the size of each piezoelectric segment. In some examples, one or more of piezoelectric segments 704 can be patterned with electrodes to form one or more transducers of equal size (for the piezoelectric segment or across all piezoelectric segments in the annular structure). In some examples, some of the piezoelectric segments 704 can be patterned with electrodes to form transducers of different sizes. In some examples, multiple transducers can be formed by patterning electrodes on top and bottom of linear piezoelectric segments 704. In some examples, multiple transducers can be formed by patterning electrodes on top and bottom of curved piezoelectric segments 704. In some examples, multiple transducers (e.g., two, three, etc.) can be formed by patterning electrodes on top and bottom of each of the linear piezoelectric segments 704, and each curved piezoelectric segment can form one transducer. In some examples, multiple transducers can be formed by patterning electrodes on top and bottom of curved piezoelectric segments 704 and each linear piezoelectric segment can form one transducer. The above combinations of patterns for transducers on different piezoelectric segments are primarily described by way of example, and it should be understood that many other combinations are possible.

As illustrated in FIGS. 6A and 6B, annular piezoelectric structure 600 is formed from a single, piezoelectric material. As described herein, using a single, annular structure (e.g., closed ring or loop) can simplify the fabrication, structural integrity and waterproofing of the device including an acoustic touch sensing system. However, an annular structure may include curved piezoelectric sections, which can be challenging to configure to achieve the desired ultrasonic characteristics. For example, shear poling may be required in order to generate acoustic energy in shear modes for liquid-agnostic touch sensing. Generally, shear poling a linear piezoelectric material can be accomplished using poling electrodes placed on the ends of the linear piezoelectric material and the poling can be linear between the ends of the linear piezoelectric material. For a piezoelectric material with a closed curved shape, however, the ends of the piezoelectric material may not be accessible for shear poling. Different techniques are discussed herein to enable shear poling of curved piezoelectric material. As illustrated in FIGS. 7A and 7B, annular structure 700 can be formed from discrete piezoelectric segments. This arrangement can provide for simplified shear poling of the linear segments due to their linear shape and open ends as compared to closed curved annular piezoelectric structure 600. Curved piezoelectric segments can also be shear poled according to the techniques described herein. The arrangements of FIGS. 6A-6B and 7A-7B both produce annular structures, but can present a design tradeoff. The closed annular piezoelectric structure of FIGS. 6A and 6B can provide improved mechanical/structural stability compared with discrete piezoelectric segments, but may present greater challenges for shear poling to achieve the desired ultrasonic characteristics. The annular structure with discrete piezoelectric segments of FIGS. 7A and 7B can provide for simplified shear poling compared with closed piezoelectric structures, but may be less mechanically/structurally sound (and perhaps provide a lesser degree of waterproofing) compared to closed annular piezoelectric structure. In particular, using separate molding and assembly of discrete transducer segments can introduce air-spaces that can sometimes lead to a poor sealing of the structure and a lower degree of structural integrity. As such, there can be a trade-off between structural integrity and acoustic efficiency when choosing between the of annular piezoelectric structure 600 and annular structure 700.

Figure 8:
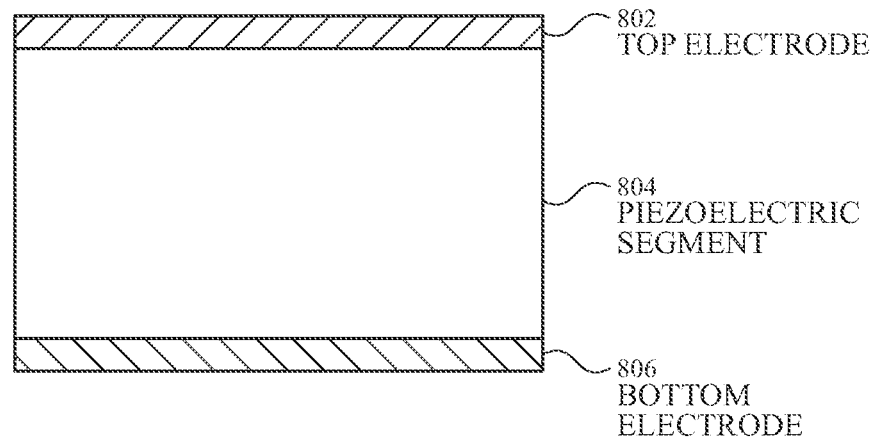
FIGS. 8-10 illustrate various patterns of electrodes on an annular piezoelectric structure or piezoelectric segment to form one or more transducers according to examples of the disclosure.
Figure 9:
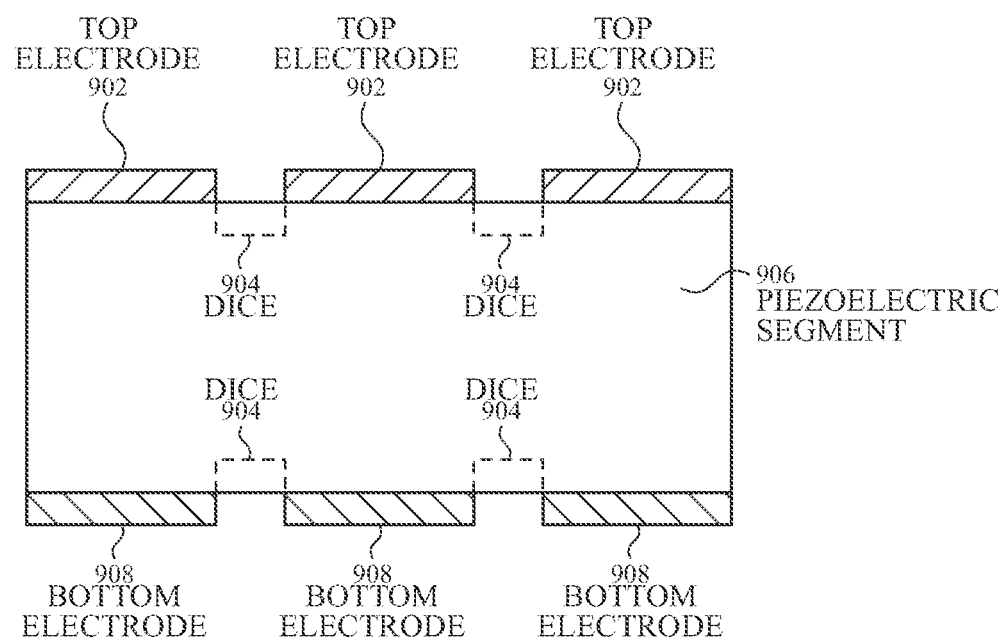
Figure 10:
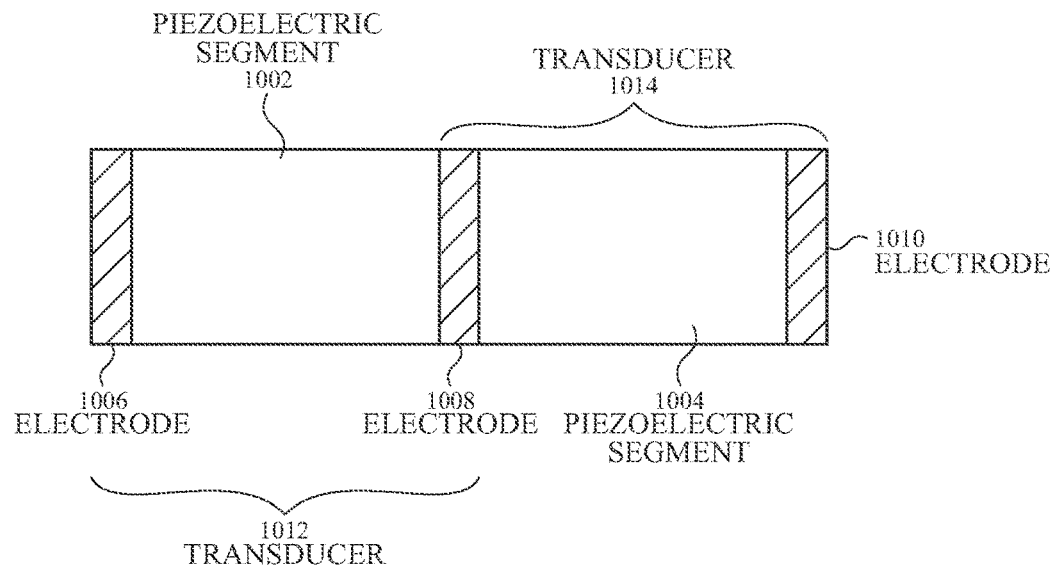

FIGS. 8-10 illustrate various patterns of electrodes on an annular piezoelectric structure or piezoelectric segment to form one or more transducers according to examples of the disclosure. For example, FIG. 8 illustrates a piezoelectric segment 804 (or a portion of annular piezoelectric structure) that can be patterned with a top electrode 802 and a bottom electrode 806 to form a transducer 800. For example, top electrode 802 and bottom electrode 806 can be formed by overlaying or depositing or otherwise disposing conductive material (e.g., a metallization layer) forming the electrodes on the opposite sides of piezoelectric segment 804. In some examples, this type of patterning can be formed on one or more discrete transducer segments of annular structure 700. Although referred to as top and bottom, the convention of "top" and "bottom" electrodes herein are exemplary with reference to the orientation of illustrated transducer in FIGS. 8-10. The electrodes may be formed on different sides that are not "top" and "bottom".

The electrodes illustrated in FIG. 8 can be patterned on annular piezoelectric structures (e.g., annular piezoelectric structure 600) or on discrete piezoelectric segments (e.g., forming annular structure 700) to form multiple transducers. For example, conductive material (e.g., metallization) can be disposed on the top surface and the bottom surface of one or more discrete transducer segments of annular structure 700. In some examples, each of the linear and curved piezoelectric segments can have a pair of electrodes for applying ultrasonic energy into the cover glass/front crystal and receiving ultrasonic energy from the cover glass/front crystal. In some examples, the conductive material can be disposed on the piezoelectric segments prior to forming the annular structure. In some examples, the conductive material can be disposed on the piezoelectric segments as part of the process of forming the annular structure. In some examples, the conductive material can be disposed on the piezoelectric segments after the annular structure is formed from the piezoelectric segments and filler material.

FIG. 9 illustrates a piezoelectric segment 906 that can be patterned with a plurality of top electrodes 902 and a plurality of bottom electrodes 908. For example, top electrodes 902 and bottom electrodes 908 can be formed by patterning conductive material (e.g., a metallization layer) on the opposite sides of piezoelectric segment 906. In some examples, the pattern can optionally be formed by dicing one or more sides of the piezoelectric material and/or the conductive material. In some examples, the top of the piezoelectric material can be diced (as indicated by dicing at 904 between top electrodes 902). Additionally, or alternatively, in some examples, the bottom of the piezoelectric material can be diced (as indicated by dicing at 904 between bottom electrodes 908). In some examples, the piezoelectric material can be diced in a first processing step and the recesses formed by dicing can be temporarily filled or masked such that deposition of the conductive material can form the pattern on portions of the piezoelectric material to form discrete top electrodes 902 and/or bottom electrodes 908. In some examples, the conductive layer can be deposited on the piezoelectric layer and diced and/or etched to form the discrete top electrodes 902 and/or bottom electrodes 908. As shown in FIG. 9, the patterning can form three transducers 910, 912, and 914 on piezoelectric segment 906. In some examples, the patterning of electrodes can be similarly formed on annular piezoelectric structure 600. In some examples, the patterning of electrodes can be similarly formed on one or more discrete piezoelectric segments forming annular structure 700. The pattern of conductive material/electrodes can correspond to the size and the shape of the resulting acoustic transducers of annular piezoelectric structure 600 or of annular structure 700. Each of the acoustic transducers can be formed by two electrodes (e.g., one top electrode and one bottom electrode) and a section/segment of the piezoelectric material in the annular structure.

In some examples, one transducer can be formed for each linear piezoelectric segment (or linear portions of an annular piezoelectric structure) and one transducer can be formed for each curved corner (e.g., as illustrated in FIGS. 7A-7B). In some examples, multiple transducers can be formed by patterning electrodes on top and bottom of one or more of linear piezoelectric segments or linear portions of an annular piezoelectric structure and/or one or more of curved piezoelectric segments or curved portions of an annular piezoelectric structure. The above patterns of electrodes used to form transducers on one or more piezoelectric segments are exemplary, and it should be understood that other patterns of electrodes are possible to form different transducer configurations.

FIGS. 8 and 9 illustrate patterning of electrodes on the top and bottom surfaces of a piezoelectric material. In such examples, the piezoelectric material can be shear poled to follow the curvature of the piezoelectric material such that stimulation applied between the top and bottom electrodes can introduce primarily or only shear waves in the surface (e.g., cover glass/front crystal). In some examples, the transducers can be formed by disposing electrodes between piezoelectric segments. FIG. 10 illustrates transducers formed from piezoelectric segments with electrodes formed there between. For example, the piezoelectric segments may be discrete piezoelectric segments of annular structure 700 or formed by fully dicing annular piezoelectric structure 600. Electrodes can be disposed on the sides of the piezoelectric material (rather than the top and bottom as in FIGS. 8 and 9). In some examples, the conductive material (e.g., metal, conductive epoxy, etc.) forming the electrodes can be shared between two piezoelectric segments as illustrated in FIG. 10. For example, conductive material forming electrode 1006 can fill the gap between piezoelectric segments 1002 and 1004. A first transducer 1012 can be formed by piezoelectric material 1002 and electrodes 1006 and 1008. A second transducer 1014 can be formed by piezoelectric material 1003 and electrodes 1006 and 1010. Transducers 1012 and 1014 can be operated in a time-multiplexed fashion so that the two transducers with a shared electrode 1006 do not interfere with one another. Although FIG. 10 shows two piezoelectric segments 1002 and 1004, it should be understood that an annular structure can be formed from two or more piezoelectric segments. Additionally, although FIG. 10 shows a shared electrode, it should be understood that in other examples, each piezoelectric segment can have two electrodes without sharing electrodes. For example, electrode 1006 can be replaced with two electrodes—one for piezoelectric material 1002 and one for piezoelectric material 1004—that can be electrically isolated by a non-conductive material disposed between the two electrodes.

Figure 11:
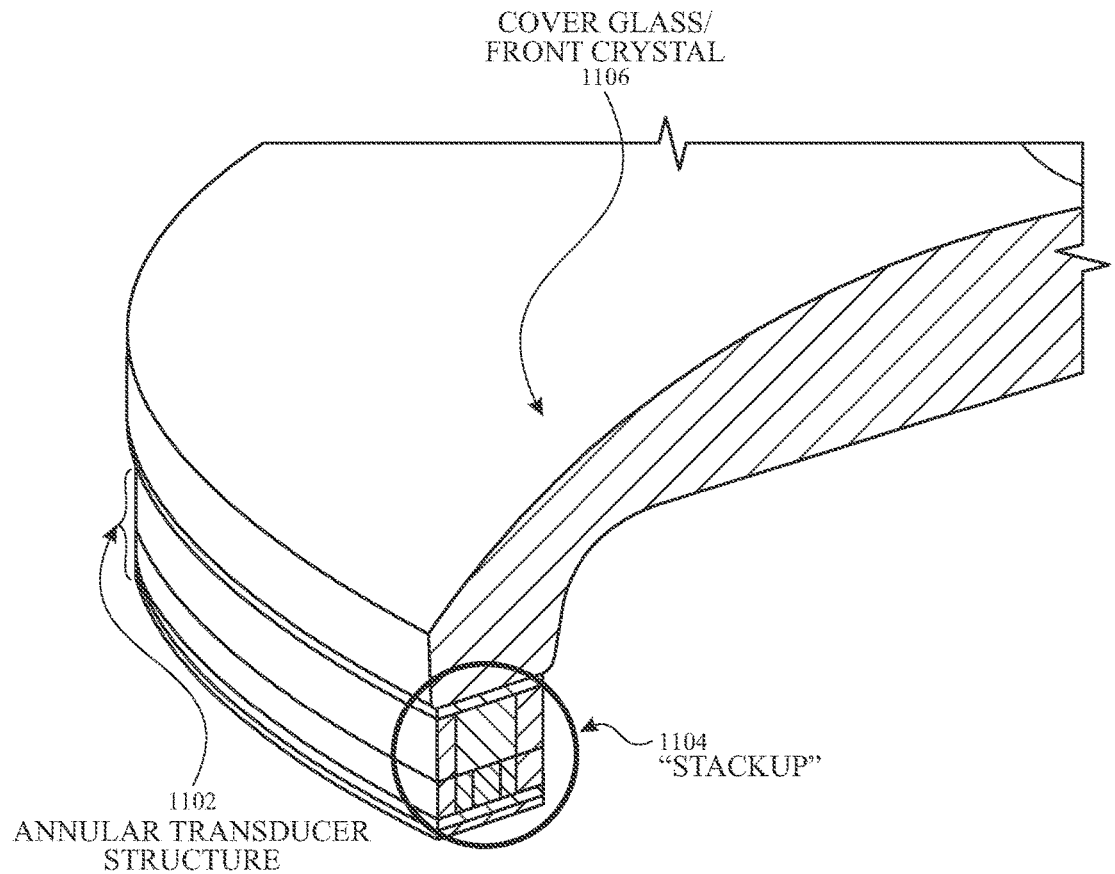
FIG. 11 illustrates a cross-section view of an annular structure and cover glass/front crystal showing an exemplary stack-up of components including a piezoelectric material of the annular structure according to examples of the disclosure.

The annular structure described herein can include additional materials beyond the piezoelectric material and electrodes forming the one or more transducers. The arrangement and properties of these additional materials can be selected to provide stability for the annular structure and provide acoustic characteristics for ultrasonic sensing. FIG. 11 illustrates a cross-section view of an annular structure (e.g., annular structure 700) and cover glass/front crystal 1106 showing an exemplary stack-up 1104 of components including a piezoelectric material of the annular structure according to examples of the disclosure. For example, the stack-up 1104 can be composed of a carrier film or front crystal datum surface), a piezoelectric material, one or more filler materials, a flex circuit, one or more pressure-sensitive adhesive (PSA) layers, one or more air gaps, conductive traces, and/or one or more conductive materials (e.g., forming electrodes as illustrated in FIGS. 8-10). Various exemplary stack-ups are described in more detail with reference to FIGS. 12-15 below. The various components described above may be selected to improve or optimize the transmission of shear waves into cover glass/front crystal 1106, reducing the absorption by the stack-up or ringing or readmission of the energy within the stack-up. Additionally, the various layers described above may be selected to reduce the transmission of compressional waves into cover glass/front crystal 1106. In some examples, the same combination and arrangement of components in the stack-up can be used for the entire length of one or more transducer segments of the annular structure to achieve efficient propagation of shear waves. In some examples, different combinations and arrangement of components can be used for different portions of one or more transducer segments of the annular structure to achieve efficient propagation of shear waves. Additionally, the thicknesses of one or more of the components constituting the stack up can be selected to achieve efficient propagation of shear waves.

Figure 12:
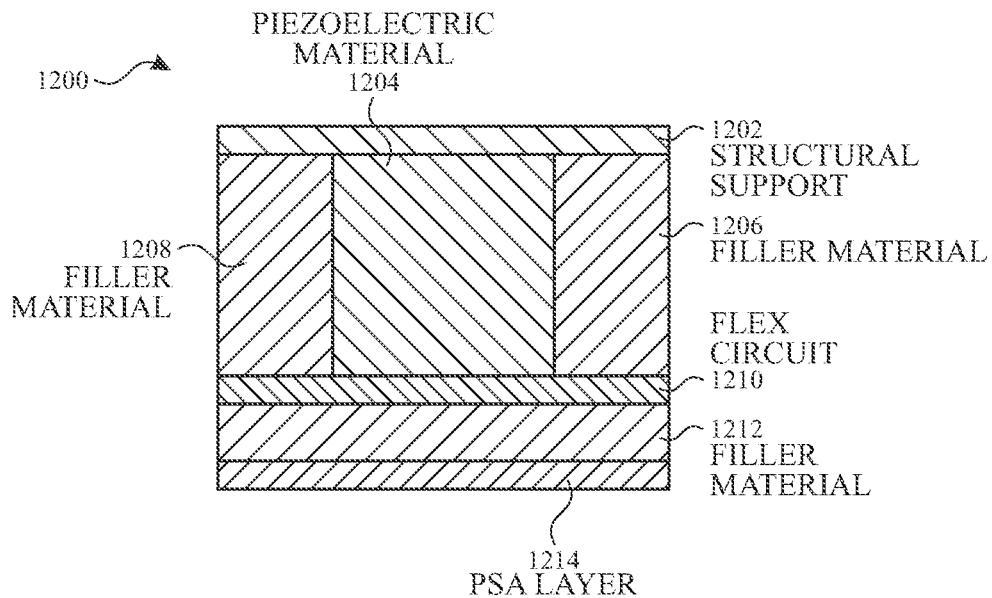
FIG. 12 illustrates an exemplary composition and arrangement of an exemplary stack-up according to examples of the disclosure.

FIG. 12 illustrates an exemplary composition and arrangement of exemplary stack-up 1200 according to examples of the disclosure. In FIG. 12, stack-up 1200 can include a carrier film or front crystal datum surface 1202, piezoelectric material 1204, filler materials 1206, 1208, 1212, flex circuit 1210 and a PSA layer 1214. For example, carrier film or front crystal datum surface 1202 can form the substrate on which the annular structure may be formed. For example, piezoelectric material 1204 and its corresponding electrodes forming the transducer (not shown) may be disposed on the carrier film or front crystal datum surface 1202. Filler material(s) 1206 and 1208 can be disposed on the sides of piezoelectric material 1204 (e.g., via injection molding). A flex circuit 1210 can be disposed below piezoelectric material 1204 (and the filler materials 1206 and 1208), and may electrically couple to the electrodes forming the transducer(s). For example, electrodes disposed on piezoelectric material 1204 may be bonded to electrode pads on flex circuit 1210. A layer of filler material 1212 can be disposed below flex circuit layer 1210. A PSA layer 1214 can be disposed below the horizontally disposed layer of filler material 1212. In some examples, PSA layer 1214 can be used to attach the annular structure to the housing of the device.

In some examples, the carrier film or front crystal datum surface 1202 can support the annular structure during its fabrication. In some examples, the carrier film or front crystal datum surface 1202 can be removed after fabrication of the annular structure prior to coupling the annular structure to the cover glass/front crystal. In some examples, the carrier film or front crystal datum surface 1202 can be coupled to the cover glass/front crystal without being removed. In some examples, the material and thickness of carrier film or front crystal datum surface 1202 can be selected to match acoustic impedance between the front crystal and the piezoelectric material (between the surface and the transducer). In some examples, the thickness of the carrier film or front crystal datum surface 1202 can be reduced to reduce the impact of impedance mismatch between the front crystal and the piezoelectric material.

As described herein, filler material (e.g., supplied in one or more filler regions or layers of the annular structure) can provide structural integrity to the annular structure and can also act as an acoustic absorbent and/or an acoustic isolation layer to provide for a better quality of ultrasonic shear waves (improving transmission of desired shear modes and reducing or eliminating undesired compressional modes), which can improve the quality of the touch sensing. The acoustic isolation and/or absorbent materials or layers can prevent or reduce ringing or generation of compressional waves. In some examples, the acoustic absorbent materials/layers (e.g., filler materials 1206, 1208, 1212) can be composed of materials with high acoustic impedance (e.g., epoxy-metal composition, etc.) that can absorb ultrasonic energy to prevent ringing. In some examples, the acoustic isolation layers (e.g., PSA layer 1214) can be composed of materials with low acoustic impedance (e.g., light epoxy silicon, PSA etc.) that can block ultrasonic energy from scattering outside of the piezoelectric material and can constrain the energy inside the piezoelectric material to prevent ringing. A pairing of filler materials to satisfy both absorption and isolation objectives may be desired for manufacturing thin electronic devices. As illustrated in the exemplary stack-up of FIG. 12, the piezoelectric material can be surrounded directly on two sides by filler material 1206 and 1208, as well as indirectly by filler material 1212 and PSA layer 1214.

Figure 13:
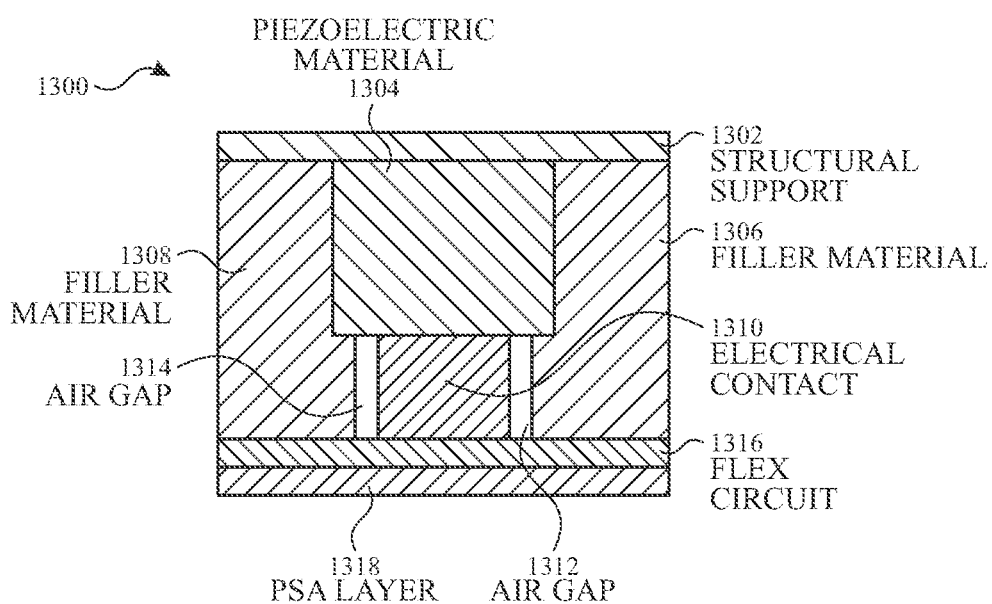
FIG. 13 illustrates an exemplary composition and arrangement of an exemplary stack-up according to examples of the disclosure.

In some examples, the electrical contacts between the electrodes and the flex circuit can be optimized for acoustic performance. For example, electrical contacts can also act as an acoustic absorbent and/or an acoustic isolation layer to provide for a better quality of ultrasonic shear waves (e.g., based on the material and the geometry of the electrical contacts). In some examples, air gaps (filled with air or other gases or in a vacuum state) can be formed to act as acoustic absorbing or isolating layers (e.g., based on the size and fill of the gaps). FIG. 13 illustrates an exemplary composition and arrangement of exemplary stack-up 1300 according to examples of the disclosure. In FIG. 13, stack-up 1300 can include a carrier film or front crystal datum surface 1302, piezoelectric material 1304, filler materials 1306, 1308, electrical contact(s) 1310, air gaps 1312, 1314, flex circuit 1316 and a PSA layer 1318. The composition and arrangement of stack-up 1300 is similar to stack-up 1200. However, unlike in stack-up 1200, in stack-up 1300 the electrodes forming the transducer (not shown) may electrically couple the flex circuit 1316 via electrical contact(s) 1310. In some examples, electrical contact(s) 1310 can be flexible contacts (e.g., pogo pins). In some examples, electrical contact(s) 1310 can be rigid contacts (e.g., solder balls). Air gaps 1312 and 1314 may surround the electrical contact(s) 1310 and separate electrical contact(s) 1310 from filler material(s) 1306 and 1308. Additionally, in some examples, unlike stack-up 1200, stack-up 1300 can dispose the PSA layer 1318 below flex circuit 1316 without intervening filler material (e.g., filler material 1212).

Figure 14:
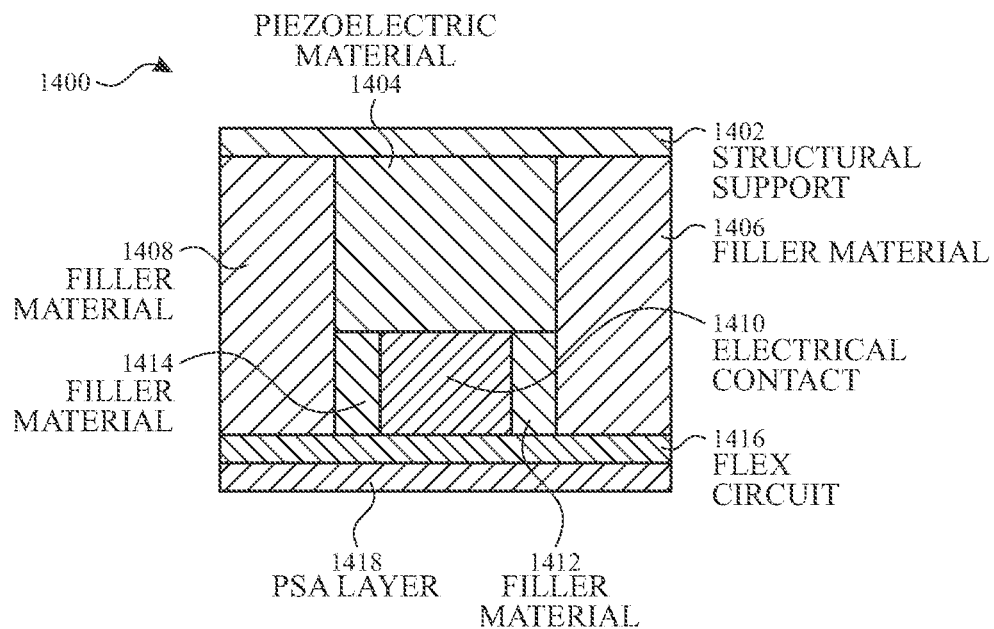
FIG. 14 illustrates an exemplary composition and arrangement of an exemplary stack-up according to examples of the disclosure.

In some examples, rather than air gaps, a second type of filler material can be disposed between electrical contact(s) and a first type of filler material. FIG. 14 illustrates an exemplary composition and arrangement of exemplary stack-up 1400 according to examples of the disclosure. In FIG. 14, stack-up 1400 can include a carrier film or front crystal datum surface 1402, piezoelectric material 1404, filler materials 1406, 1408, 1412, 1414, electrical contact(s) 1410, flex circuit 1416 and a PSA layer 1418. The composition and arrangement of stack-up 1400 is similar to stack-up 1300. However, unlike stack-up 1300, stack-up 1400 can include second filler materials 1412 and 1414, different from first filler materials 1406 and 1408, disposed (e.g., via injection molding) below the piezoelectric material 1404 and surrounding the sides of electrical contact(s) 1410.

As described herein, filler material (e.g., supplied in one or more filler regions or layers) can provide structural integrity to the annular structure and can also act as an acoustic absorbent and/or an acoustic isolation layer to provide for a better quality of ultrasonic shear waves (improving transmission of desired shear modes and reducing or eliminating undesired compressional modes), which can improve the quality of the touch sensing. For example, in FIG. 14, filler layers 1406 and 1408 may be formed of one type of material and may provide acoustic absorbent characteristics and filler layers 1412 and 1414 may be formed of another type of material and may provide acoustic isolation characteristics. In other examples, filler layers 1406 and 1408 may be formed of one type of material and may provide acoustic isolation characteristics and filler layers 1412 and 1414 may be formed of another type of material and may provide acoustic absorbent characteristics. In other examples, filler layers 1406 and 1408 may be formed of one type of material and may provide a combination of acoustic absorbent and acoustic isolation characteristics and filler layers 1412 and 1414 may be formed of another type of material and may provide another combination of acoustic absorbent and acoustic isolation characteristics.

Figure 15:
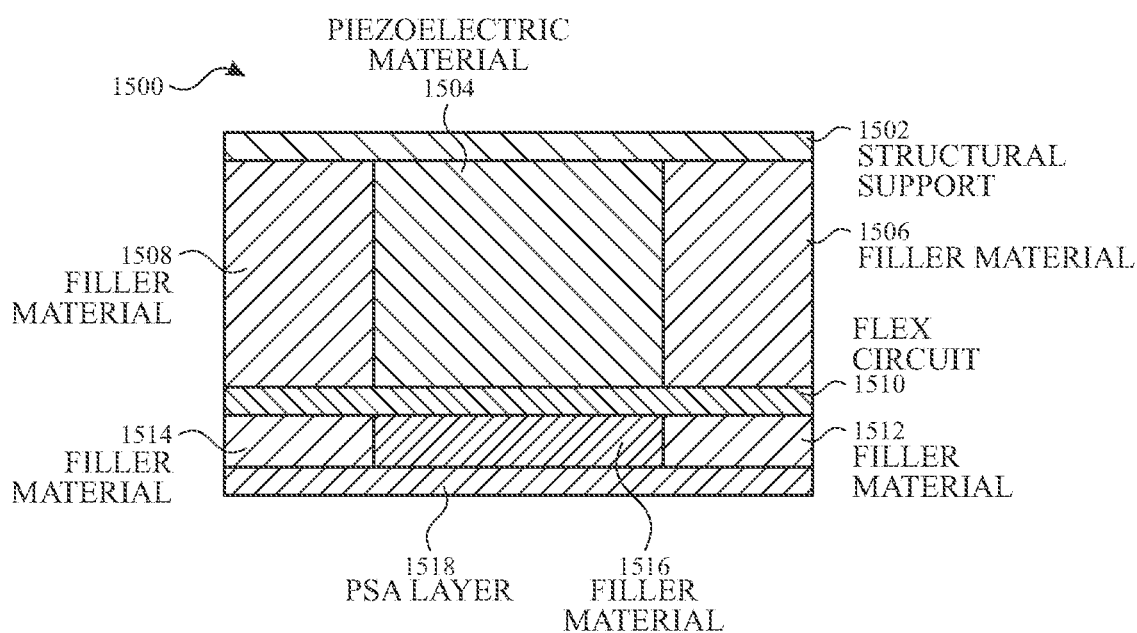
FIG. 15 illustrates an exemplary composition and arrangement of an exemplary stack-up according to examples of the disclosure.

In some examples, a second type of filler material can be disposed beneath the flex circuit rather than surrounding contact electrodes between the transducer electrodes and the flex circuit. FIG. 15 illustrates an exemplary composition and arrangement of exemplary stack-up 1500 according to examples of the disclosure. In FIG. 15, stack-up 1500 can include a carrier film or front crystal datum surface 1502, piezoelectric material 1504, filler materials 1506, 1508, 1512, 1514, 1516, flex circuit 1510 and a PSA layer 1518. The composition and arrangement of stack-up 1500 is similar to stack-up 1200. However, unlike stack-up 1200, stack up 1500 can include a filler layer formed of filler material(s) 1512, 1514 and 1516 disposed below flex circuit layer 1510. For example, in FIG. 15, filler layers 1506, 1508, 1512 and 1514 may be formed from one type of material and may provide acoustic isolation characteristics and filler layer 1516 may be formed from another type of material and may provide acoustic absorbent characteristics.

Figure 16:
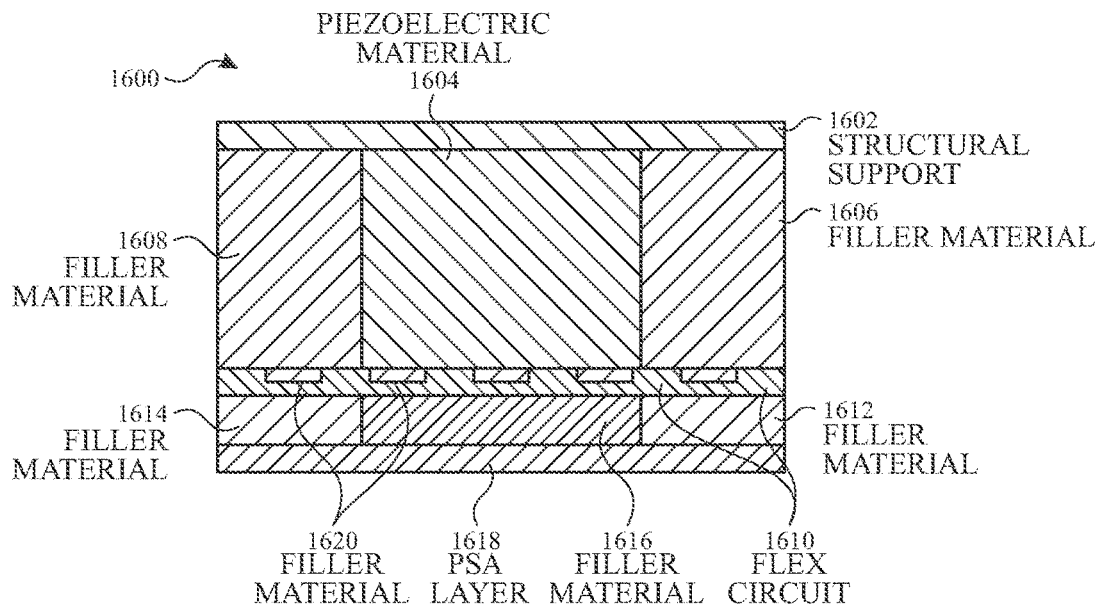
FIG. 16 illustrates an exemplary composition and arrangement of an exemplary stack-up according to examples of the disclosure.

In some examples, the flex circuit can include filler material (absorbent or isolation) to improve acoustic performance. FIG. 16 illustrates an exemplary composition and arrangement of exemplary stack-up 1600 according to examples of the disclosure. In FIG. 16, stack-up 1600 can include a carrier film or front crystal datum surface 1602, piezoelectric material 1604, filler materials 1606, 1608, 1612, 1614, 1616, 1620, flex circuit 1610 and a PSA layer 1618. The composition and arrangement of stack-up 1600 is similar to stack-up 1500. However, unlike stack-up 1500, stack-up 1600 can include filler material(s) 1620 disposed in flex circuit 1610. In some examples, filler material(s) 1620 can be embedded in the flex circuit 1610. In some examples the filler material(s) 1620 can be disposed interstitially, for example, as illustrated in FIG. 16, section(s) of filler material 1620 can be disposed adjacent to section(s) of flex circuit 1610. In some examples, filler material(s) 1620 may be formed from one type of material and may provide similar acoustic isolation and/or acoustic absorbent characteristics. In some examples, filler material(s) 1620 may be formed from more than one type of material and may provide different acoustic isolation and/or acoustic absorbent characteristics.

Figure 17:
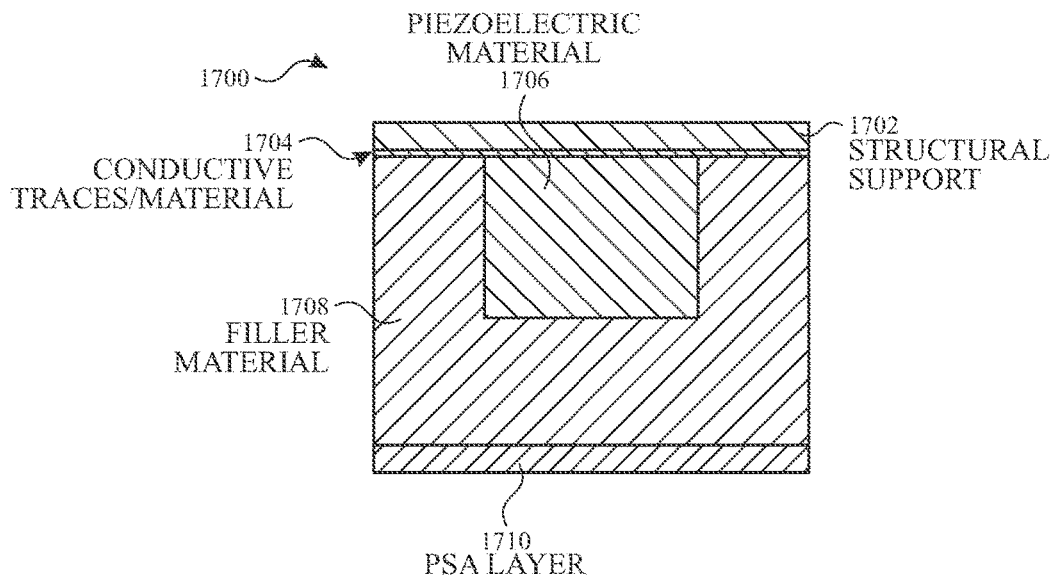
FIG. 17 illustrates an exemplary composition and arrangement of an exemplary stack-up according to examples of the disclosure.

In some examples, the coupling between the transducers and touch sensing circuitry can be implemented by forming conductive traces and/or conductive material directly patterned on to carrier film or front crystal surface. The conductive traces and/or conductive material can be used to route to the electrodes to sense circuitry, such as acoustic touch sensing circuit 400 (e.g., along the surface of the carrier film or front crystal surface). FIG. 17 illustrates an exemplary composition and arrangement of exemplary stack-up 1700 according to examples of the disclosure. In FIG. 17, stack-up 1700 can include a carrier film or front crystal datum surface 1702, conductive traces and/or conductive material 1704, piezoelectric material 1706, filler material 1708 and a PSA layer 1710. Unlike stack-ups 1200-1600, in which the electrodes of the transducer(s) couple to a flex circuit (and thereby couple to the acoustic touch sensing circuit 400), stack-up 1700 can include conductive traces and/or conductive material 1704 directly patterned on to carrier film or front crystal surface 1702. The conductive traces and/or conductive material 1704 can be used to route to the electrodes to sense circuitry, such as acoustic touch sensing circuit 400 (e.g., along the surface of the carrier film or front crystal surface). In some examples, the conductive material disposed on the carrier film or front crystal surface 1702 can form bonding pads for the electrodes disposed on piezoelectric material 1706. In some examples, the electrodes themselves can be disposed on the carrier film or front crystal surface 1702 and the piezoelectric material 1706 can be disposed on the electrode (e.g., rather than first depositing the electrode on the piezoelectric material. Additionally, unlike stack-ups 1200-1600, Filler material(s) 1708 can be disposed directly on the three sides and surrounding piezoelectric material 1706 (e.g., via injection molding). A PSA layer 1710 can be disposed directly below the filler material 1708. Eliminating the flex layer can simplify the composition of the stack-up by reducing the number of layers and processing steps. Simplifying the stack-up can provide more homogeneity of materials which can simplify the process of tuning the acoustic characteristics.

Figure 18:
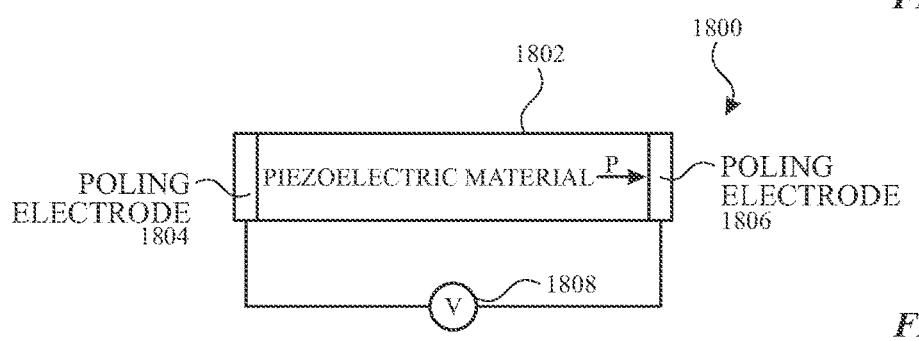
FIG. 18 illustrates an exemplary configuration for shear poling a linear piezoelectric material according to examples of the disclosure.

As discussed herein, to improve performance of an acoustic touch sensing system, it can be desirable to stimulate the piezoelectric transducers to generate energy in a desired shear mode (or more than one desired shear mode) and reduce energy in undesired modes (parasitic modes). Poling (e.g., using electric fields) can be performed to form electrical dipoles in a preferred direction (i.e., poling direction) so that excitation of the piezoelectric material can generate energy predominantly or solely in the mode of interest and reduce or eliminate parasitic modes. FIG. 18 illustrates an exemplary configuration 1800 for shear poling a linear piezoelectric material according to examples of the disclosure. FIG. 18 illustrates a piezoelectric material 1802 without curves. For example, piezoelectric material 1802 can correspond to a side view of one of linear piezoelectric segments of piezoelectric segments 704. To shear pole linear piezoelectric material 1802, poling electrodes 1804 and 1806 can be placed on opposite ends of the piezoelectric material (e.g., before assembly of the annular structure 700). A voltage can be supplied across piezoelectric material 1802 via poling electrodes 1804 and 1806 to generate an electric field across piezoelectric material 1802 in the direction shown by the arrow (P→). The poling direction for a linear piezoelectric material 1802 can be linear in the direction between the two poling electrodes 1804 and 1806. In some examples, the poling can be performed by applying a threshold voltage (e.g., to generate an electric field on the order of 1-100 kV/mm) across the piezoelectric material for a threshold period of time (e.g., 1-20 minutes), optionally in an oil (e.g., silicone oil) heated to a threshold temperature (e.g., 80° C.). In some examples, the duration of time and applied voltage (and corresponding electric field) can be traded off (e.g., a larger voltage may be applied for a shorter duration to achieve the desired poling characteristic). The poling process can form electric dipoles in the direction of the electric field that can remain after the electric field is removed. The electric dipoles formed in a uniform direction can allow for a more uniform behavior increasing the energy in a desired shear mode of operation and decreasing energy in parasitic modes.

As illustrated in FIG. 18, shear poling a linear piezoelectric material can be accomplished using poling electrodes placed on the ends of the linear piezoelectric material and the poling can be linear between the ends of the linear piezoelectric material. For an annular piezoelectric structure (e.g., annular piezoelectric structure 600), however, the ends of the piezoelectric material may not be accessible for shear poling. Furthermore, for a piezoelectric material with a curved shape, even when the ends are accessible (e.g., curved piezoelectric segments of the piezoelectric segments 704 in annular structure 700), the curve shape may not provide the proper poling direction shear linear poling using two electrodes at opposite ends of the piezoelectric material can result in poling direction that diverges from the curvature of the piezoelectric material. Such shear poling can result in irregular behavior including reduced or no energy in the mode of interest and increased energy in parasitic modes. Improved performance (i.e., to reduce parasitic modes) can be achieved for curved piezoelectric material when the poling direction for shear poling follows the curvature of the piezoelectric material.

Figure 19A:
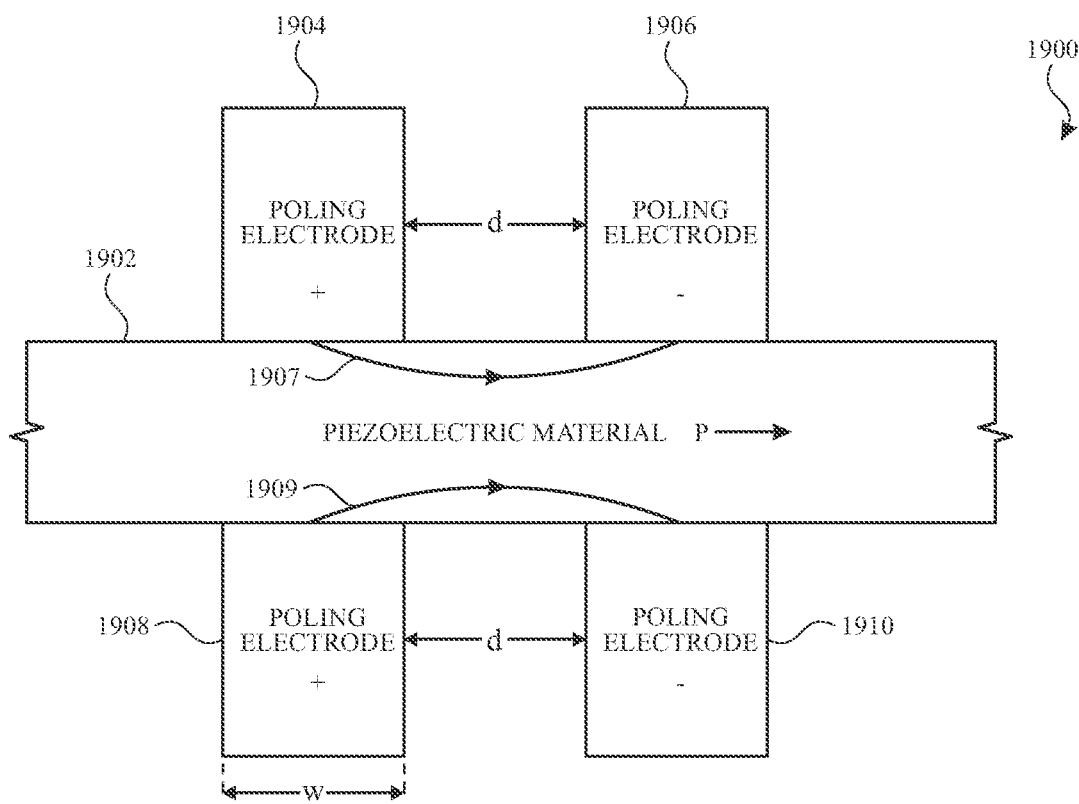
FIGS. 19A-B illustrate exemplary poling configurations for shear poling linear segments and curved segments of a piezoelectric material according to examples of the disclosure.
Figure 19B:
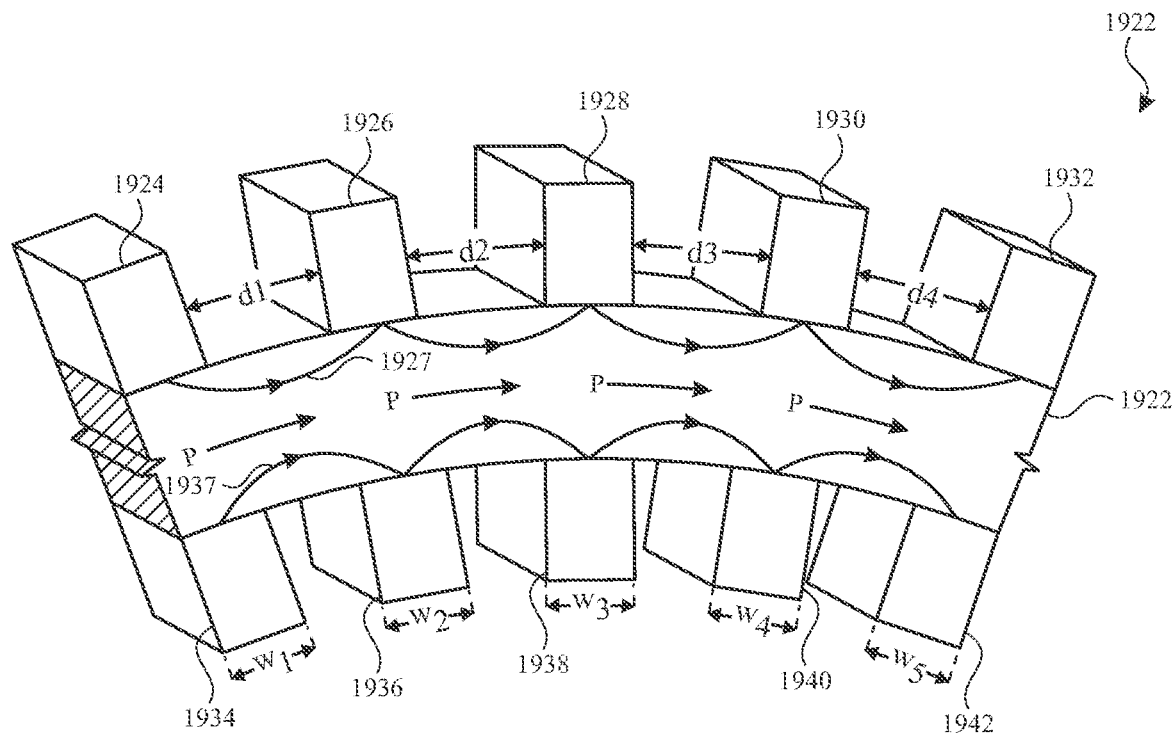

FIGS. 19A-B illustrate exemplary poling configurations 1900 and 1920 for shear poling linear segments and curved segments of a piezoelectric material according to examples of the disclosure. FIG. 19A illustrates a piezoelectric material 1902 without curves. For example, piezoelectric material 1902 can correspond to a side view a linear portion of annular piezoelectric structure 600 in FIG. 6A. To shear pole a linear portion of piezoelectric material 1902, poling electrodes 1904 and 1906 can be placed on top of the piezoelectric material (e.g., the surface to be coupled to cover glass 602 in FIG. 6A). A voltage can be supplied between poling electrodes 1904 and 1906 to generate a local electric field in piezoelectric material 1902. As illustrated by electric field line 1907, an electric field can be introduced into piezoelectric material between the poling electrodes 1904 and 1906. Although the field lines may not be strictly linear in this configuration (unlike in FIG. 18), the segment of piezoelectric material between poling electrodes 1904 and 1906 can be shear poled in the direction shown by the arrow (P→). In addition to shear poling using poling electrodes 1904 and 1906, poling electrodes 1908 and 1910 can be placed on bottom of the piezoelectric material (opposite poling electrodes 1904 and 1906). A voltage can be supplied between poling electrodes 1908 and 1910 to generate an electric field in piezoelectric material 1902. As illustrated by electric field line 1909, an electric field can be introduced into piezoelectric material between the poling electrodes 1908 and 1910. Although the field lines may not be strictly linear in this configuration, the segment of piezoelectric material between poling electrodes 1908 and 1910 can be shear poled in the direction shown by the arrow (P→). In some examples, the poling by electrodes 1904 and 1906 and the poling by electrodes 1908 and 1910 can occur at the same time to strengthen the total electric field in the poling direction and/or to cancel out the non-linear poling direction components. As a result of the shear poling, a segment of the piezoelectric material between the poling electrodes can be poled in a linear direction to follow the trajectory of the linear segment. As discussed herein, the process can be repeated for additional segments to shear-pole some or all of the piezoelectric material.

FIG. 19B illustrates a piezoelectric material 1922 with curves. For example, piezoelectric material 1922 can correspond to a side view of a curved portion of annular piezoelectric structure 600 or a curved segment of annular structure 700. To shear-pole curved piezoelectric material 1922, poling electrodes 1924 and 1926 can be placed on top of the piezoelectric material (e.g., the surface to be coupled to cover glass 602, 702 in FIGS. 6A and 7A). A voltage can be supplied between poling electrodes 1924 and 1926 to generate an electric field in piezoelectric material 1922. As illustrated by electric field line 1927, an electric field can be introduced into piezoelectric material. Although the field lines may not strictly follow the curvature, the segment of piezoelectric material between poling electrodes 1924 and 1926 can be shear poled in the direction shown by the arrow (P→), which can approximate (linearly) the curvature of the piezoelectric material between the poling electrodes. In other words, the poling direction for the segment can be tangential to the curvature of the segment (or within a threshold of the line tangent to the curvature of the segment). In addition to shear poling using poling electrodes 1924 and 1926, poling electrodes 1934 and 1936 can be placed on bottom of the piezoelectric material (e.g., opposite poling electrodes 1924 and 1926). A voltage can be supplied between poling electrodes 1934 and 1936 to generate an electric field in piezoelectric material 1922. As illustrated by electric field line 1937, an electric field can be introduced into piezoelectric material. Although the field lines may not strictly follow the curvature, the segment of piezoelectric material between poling electrodes 1934 and 1936 can be shear poled in the direction shown by the arrow (P→), which can approximate (linearly) the curvature of the piezoelectric material between the poling electrodes. In some examples the poling by electrodes 1924 and 1926 and the poling by electrodes 1934 and 1936 can occur at the same time to strengthen the total electric field and/or to cancel out portions of poling direction components not following the curvature of the piezoelectric material. As a result of the poling, a segment between the poling electrodes can be poled to follow the trajectory of the curvature of the segment (e.g., approximated by linearly poling segments). As discussed herein, the process can be repeated for additional segments by applying a voltage between adjacent poling electrodes (e.g., between electrodes 1926, 1928, 1930, 1932 and between electrodes 1936, 1938, 1940 and 1942) to shear-pole some or all of the piezoelectric material.

It should be understood that the poling configuration of FIGS. 19A and 19B may not result in a poling direction exactly matching the linear or curved trajectory of the piezoelectric material. In some examples, the poling can be performed so that the poling direction of the piezoelectric material can be within a threshold amount of the trajectory of the curved material (e.g., within 1%, 5%, etc.). In some examples, the poling can be performed so that a threshold percentage (e.g., 80%, 95%, etc.) of the total energy can be generated in the desired shear mode and/or so that less than a percentage of the total energy generated in the parasitic mode can be less than a threshold (e.g., 5%, 10%, etc.)

As discussed above, the linear shear poling process of FIG. 18 can be a function of the poling voltage (and corresponding electric field) across the piezoelectric material and poling time. Additionally, the shear poling processes illustrated in FIGS. 19A and 19B for linear and curved segments can be a function of the width of the poling electrodes and of the separation distance between poling electrodes. For example, decreasing the width of the poling electrodes and/or decreasing the separation distance between poling electrodes can allow for increasing the density of segments for a piezoelectric material. Increasing the density of segments can result in poling smaller segments so that the shear poling direction better approximates the curvature (or linearity) of each segment. In some examples, the distance between poling electrodes and/or the width of poling electrodes can be the same for poling the entire piezoelectric material. In some examples, the distance between poling electrodes and/or the width of poling electrodes can be different for poling different segments of the piezoelectric material. For example, to better approximate the curvature of a curved segment of the piezoelectric material, the spacing between poling electrodes can be decreased and/or the width of the poling electrodes can be reduced as compared with the distance and/or width for a linear segment of the piezoelectric material.

Referring back to FIGS. 19A-19B, the distance d between poling electrodes 1904 and 1906 for poling a linear segment can be larger than distances $d_1$-$d_4$ between poling electrodes 1924, 1926, 1928, 1930 and 1932 for a curved segment (i.e., d>$d_1$-$d_4$). In some examples, the distance $d_1$-$d_4$ between poling electrodes 1924, 1926, 1928, 1930 and 1932 can be uniform for curved segments (i.e., $d_1$=$d_2$=$d_3$=$d_4$). In some examples, the distance between poling electrodes can be different for different curved segments, where the separation distance can be a function of the curvature (smaller distance for segments with more curvature). Additionally or alternatively, the width w of the poling electrodes for a linear segment can be larger than the widths $w_1$-$w_5$ of poling electrodes for curved segments (i.e., w>$w_1$-$w_5$). In some examples, the widths $w_1$-$w_5$ can be uniform for poling electrodes for curved segments (i.e., $w_1$=$w_2$=$w_3$=$w_4$=$w_5$). In some examples, the width of poling electrodes can be different for different curved segments, where the width can be a function of the curvature (smaller width for segments with more curvature).

Therefore, according to the above, some examples of the disclosure are directed to an annular structure comprising a plurality of transducers. The annular structure can comprise a plurality of piezoelectric segments and filler material disposed between the plurality of piezoelectric segments. The plurality of piezoelectric segments and filler material can form an annular shape. Additionally or alternatively to one or more of the examples disclosed above, in some examples, the piezoelectric segments can be shear poled. Additionally or alternatively to one or more of the examples disclosed above, in some examples, the filler material can be selected to provide acoustic characteristics to achieve efficient propagation of shear waves (e.g., to prevent ringing, absorb compressional energy, improved transmission of shear energy into a surface). Additionally or alternatively to one or more of the examples disclosed above, in some examples, one of the plurality of transducers can be formed by one of the plurality of piezoelectric segments, a first electrode on a first side of the one of the plurality of piezoelectric segments, and a second electrode on a second side of the one of the plurality of piezoelectric segments. Additionally or alternatively to one or more of the examples disclosed above, in some examples, two or more of the plurality of transducers can be formed by one of the plurality of piezoelectric segments, one or more first electrodes patterned on a first side of the one of the plurality of piezoelectric segments, and one or more second electrodes patterned on a second side of the one of the plurality of piezoelectric segments. Additionally or alternatively to one or more of the examples disclosed above, in some examples, the filler material can be further disposed on a plurality of sides of a piezoelectric segment of the plurality of piezoelectric segments. Additionally or alternatively to one or more of the examples disclosed above, in some examples, the filler material can comprise one or more types of filler material. Additionally or alternatively to one or more of the examples disclosed above, in some examples, the annular structure can further comprise a carrier film. The plurality of piezoelectric segments can be disposed below the carrier film. Additionally or alternatively to one or more of the examples disclosed above, in some examples, the annular structure can further comprise a front crystal datum surface. The plurality of piezoelectric segments can be disposed below the front crystal datum surface. Additionally or alternatively to one or more of the examples disclosed above, in some examples, the annular structure can further comprise one or more conductive traces disposed on the carrier film or the front crystal datum surface. Additionally or alternatively to one or more of the examples disclosed above, in some examples, the annular structure can further comprise a flex circuit. The flex circuit can be disposed below the plurality of piezoelectric segments. Additionally or alternatively to one or more of the examples disclosed above, in some examples, annular structure can further comprise additional filler material disposed below the flex circuit. Additionally or alternatively to one or more of the examples disclosed above, in some examples, the annular structure can further comprise additional filler material disposed within the flex circuit. Additionally or alternatively to one or more of the examples disclosed above, in some examples, annular structure can further comprise a pressure-sensitive adhesive (PSA) layer disposed below the flex circuit. Additionally or alternatively to one or more of the examples disclosed above, in some examples, the flex circuit can directly contact one or more electrodes patterned on the plurality of piezoelectric segments. Additionally or alternatively to one or more of the examples disclosed above, in some examples, the flex circuit can be coupled to one or more electrodes patterned on the plurality of piezoelectric segments via one or more electrical contacts. Additionally or alternatively to one or more of the examples disclosed above, in some examples, the one or more electrical contacts can comprise pogo pins. Additionally or alternatively to one or more of the examples disclosed above, in some examples, filler material disposed between the plurality of piezoelectric segments and the flex circuit can form one or more air gaps around the one or more electrical contacts.

Some examples of the disclosure are directed to an annular transducer structure comprising a plurality of transducers. The annular transducer structure can comprise an annular piezoelectric structure and filler material surrounding the annular piezoelectric structure. The annular piezoelectric structure and filler material can form an annular shape. Additionally or alternatively to one or more of the examples disclosed above, in some examples, the piezoelectric segments can be shear poled. Additionally or alternatively to one or more of the examples disclosed above, in some examples, the filler material can be selected to provide acoustic characteristics to achieve efficient propagation of shear waves (e.g., to prevent ringing, absorb compressional energy, improved transmission of shear energy into a surface). Additionally or alternatively to one or more of the examples disclosed above, in some examples, two or more of the plurality of transducers can be formed from the annular piezoelectric structure, one or more first electrodes patterned on a first side of the annular piezoelectric structure, and one or more second electrodes patterned on a second side of the annular piezoelectric structure. Additionally or alternatively to one or more of the examples disclosed above, in some examples, the filler material can be further disposed on a plurality of sides of the annular piezoelectric structure. Additionally or alternatively to one or more of the examples disclosed above, in some examples, the filler material can comprise one or more types of filler material. Additionally or alternatively to one or more of the examples disclosed above, in some examples, the annular transducer structure can further comprise a carrier film. The annular piezoelectric structure can be disposed below the carrier film. Additionally or alternatively to one or more of the examples disclosed above, in some examples, the annular transducer structure can further comprise a front crystal datum surface. The annular piezoelectric structure can be disposed below the front crystal datum surface. Additionally or alternatively to one or more of the examples disclosed above, in some examples, annular piezoelectric structure can further comprise one or more conductive traces disposed on the carrier film or the front crystal datum surface. Additionally or alternatively to one or more of the examples disclosed above, in some examples, annular piezoelectric structure can further comprise a flex circuit. The flex circuit can be disposed below the annular piezoelectric structure. Additionally or alternatively to one or more of the examples disclosed above, in some examples, the annular piezoelectric structure can further comprise additional filler material disposed below the flex circuit. Additionally or alternatively to one or more of the examples disclosed above, in some examples, the annular piezoelectric structure can further comprise additional filler material disposed within the flex circuit. Additionally or alternatively to one or more of the examples disclosed above, in some examples, the annular piezoelectric structure can further comprise a pressure-sensitive adhesive (PSA) layer disposed below the flex circuit. Additionally or alternatively to one or more of the examples disclosed above, in some examples, the flex circuit can directly contacts one or more electrodes patterned on the annular piezoelectric structure. Additionally or alternatively to one or more of the examples disclosed above, in some examples, the flex circuit can be coupled to one or more electrodes patterned on the annular piezoelectric structure via one or more electrical contacts. Additionally or alternatively to one or more of the examples disclosed above, in some examples, the one or more electrical contacts can comprise pogo pins. Additionally or alternatively to one or more of the examples disclosed above, in some examples, filler material disposed between the annular piezoelectric structure and the flex circuit can form one or more air gaps around the one or more electrical contacts.

Some examples of the disclosure are directed to forming the annular structures with stack-ups as described herein (e.g., as illustrated in FIGS. 11-17).

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

What is claimed is:

1. An annular structure comprising a plurality of transducers, the annular structure comprising:
   a plurality of piezoelectric segments disposed in a plane; and
   filler material disposed in the plane between the plurality of piezoelectric segments;
   wherein the plurality of piezoelectric segments and filler material form an annular shape surrounding a hollow area of the annular structure located in the plane, and the plurality of piezoelectric segments are configured to generate one or more acoustic waves along a surface, at least a portion of the surface parallel to the plane when the surface is coupled to the annular structure.

2. The annular structure of claim 1, wherein:
one of the plurality of transducers is formed by one of the plurality of piezoelectric segments, a first electrode on a first side of the one of the plurality of piezoelectric segments, and a second electrode on a second side of the one of the plurality of piezoelectric segments.

3. The annular structure of claim 1, wherein:
two or more of the plurality of transducers is formed by one of the plurality of piezoelectric segments, one or more first electrodes patterned on a first side of the one of the plurality of piezoelectric segments, and one or more second electrodes patterned on a second side of the one of the plurality of piezoelectric segments.

4. The annular structure of claim 1, wherein the filler material is further disposed on a plurality of sides of a piezoelectric segment of the plurality of piezoelectric segments.

5. The annular structure of claim 1, wherein the filler material comprises one or more types of filler material.

6. The annular structure of claim 1, further comprising a carrier film or a front crystal datum surface, the plurality of piezoelectric segments disposed below the carrier film or the front crystal datum surface.

7. The annular structure of claim 6, further comprising one or more conductive traces disposed on the carrier film or the front crystal datum surface.

8. The annular structure of claim 6, further comprising a flex circuit, wherein the flex circuit is disposed below the plurality of piezoelectric segments.

9. The annular structure of claim 8, further comprising: additional filler material disposed below the flex circuit.

10. The annular structure of claim 8, further comprising: additional filler material disposed within the flex circuit.

11. The annular structure of claim 8, further comprising a pressure-sensitive adhesive (PSA) layer disposed below the flex circuit.

12. The annular structure of claim 8, wherein the flex circuit directly contacts one or more electrodes patterned on the plurality of piezoelectric segments.

13. The annular structure of claim 8, wherein the flex circuit is coupled to one or more electrodes patterned on the plurality of piezoelectric segments via one or more electrical contacts.

14. The annular structure of claim 13, wherein the one or more electrical contacts comprise pogo pins.

15. The annular structure of claim 13, wherein filler material disposed between the plurality of piezoelectric segments and the flex circuit forms one or more air gaps around the one or more electrical contacts.

16. An annular transducer structure comprising a plurality of transducers, the annular transducer structure comprising:
an annular piezoelectric structure disposed in a plane; and
filler material surrounding the annular piezoelectric structure, the filler material disposed in the plane;
wherein the annular piezoelectric structure and filler material form an annular shape surrounding a hollow area of the annular structure located in the plane, and the annular piezoelectric structure is configured to generate one or more acoustic waves along a surface, at least a portion of the surface parallel to the plane when the surface is coupled to the annular structure.

17. The annular transducer structure of claim 16, wherein:
two or more of the plurality of transducers are formed from the annular piezoelectric structure, one or more first electrodes patterned on a first side of the annular piezoelectric structure, and one or more second electrodes patterned on a second side of the annular piezoelectric structure.

18. The annular transducer structure of claim 16, wherein the filler material is further disposed on a plurality of sides of the annular piezoelectric structure.

19. The annular transducer structure of claim 16, wherein the filler material comprises one or more types of filler material.

20. The annular transducer structure of claim 16, further comprising a carrier film or a front crystal datum surface, the annular piezoelectric structure disposed below the carrier film or the front crystal datum surface.

21. An electronic device, comprising:
a surface; and
an annular structure comprising a plurality of transducers and filler material surrounding a hollow area of the annular structure, the annular structure coupled to the surface, the annular structure disposed in a plane parallel to the surface, wherein the plurality of transducers are configured to generate one or more acoustic waves along the surface.

22. The electronic device of claim 21, wherein the surface includes a cover material of the electronic device, the electronic device further comprising:
a display disposed within the hollow area of the annular structure.

* * * * *